US011398582B2

(12) United States Patent
Nakamura et al.

(10) Patent No.: US 11,398,582 B2
(45) Date of Patent: Jul. 26, 2022

(54) SEMICONDUCTOR LIGHT-EMITTING ELEMENT AND ELECTRONIC APPARATUS

(71) Applicant: SONY CORPORATION, Tokyo (JP)

(72) Inventors: Masatoshi Nakamura, Kanagawa (JP); Mamoru Suzuki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 78 days.

(21) Appl. No.: 16/763,220

(22) PCT Filed: Nov. 9, 2018

(86) PCT No.: PCT/JP2018/041622
§ 371 (c)(1),
(2) Date: May 11, 2020

(87) PCT Pub. No.: WO2019/098131
PCT Pub. Date: May 23, 2019

(65) Prior Publication Data
US 2021/0074885 A1  Mar. 11, 2021

(30) Foreign Application Priority Data
Nov. 20, 2017  (JP) .............................. JP2017-222515

(51) Int. Cl.
H01L 33/22 (2010.01)
H01L 33/46 (2010.01)
H01L 25/075 (2006.01)

(52) U.S. Cl.
CPC .......... H01L 33/22 (2013.01); H01L 25/0753 (2013.01); H01L 33/46 (2013.01); H01L 2933/0083 (2013.01)

(58) Field of Classification Search
None
See application file for complete search history.

(56) References Cited

U.S. PATENT DOCUMENTS 9,287,464 B2 *   3/2016   Saito ....................... H01L 33/26
2015/0041836 A1   2/2015   Saito et al.

FOREIGN PATENT DOCUMENTS

CN   104347768 A    2/2015
JP   50-116363 U    9/1975
(Continued)

OTHER PUBLICATIONS

International Search Report and Written Opinion of PCT Application No. PCT//JP2018/041622, dated Jan. 22, 2019, 07 pages of ISRWO.

Primary Examiner — Robert K Carpenter
(74) Attorney, Agent, or Firm — Chip Law Group

(57) ABSTRACT

A semiconductor light-emitting element according to an embodiment of the present technology includes a first electrode, a second electrode, a light-emitting layer constituted by a semiconductor, and an optical functional film. The light-emitting layer includes a first surface that is connected to the first electrode and has a first convexo-concave structure, a second surface that is connected to the second electrode, has a second convexo-concave structure, and is opposite to the first surface, and a peripheral surface that continuously connects the first surface and the second surface to each other. The optical functional film coats the second surface and the peripheral surface and includes a reflecting layer capable of reflecting light emitted by the light-emitting layer.

18 Claims, 14 Drawing Sheets

(56) References Cited

FOREIGN PATENT DOCUMENTS

| | | |
|---|---|---|
| JP | 50-116363 U1 | 9/1975 |
| JP | 2008-227456 A | 9/2008 |
| JP | 2009-229507 A | 10/2009 |
| JP | 2010-171341 A | 8/2010 |
| JP | 2015-032809 A | 2/2015 |

* cited by examiner

SEMICONDUCTOR LIGHT-EMITTING ELEMENT AND ELECTRONIC APPARATUS

CROSS REFERENCE TO RELATED APPLICATIONS

This application is a U.S. National Phase of International Patent Application No. PCT/JP2018/041622 filed on Nov. 9, 2018, which claims priority benefit of Japanese Patent Application No. JP 2017-222515 filed in the Japan Patent Office on Nov. 20, 2017. Each of the above-referenced applications is hereby incorporated herein by reference in its entirety.

TECHNICAL FIELD

The present technology relates to a semiconductor light-emitting element including a light-emitting layer constituted by a semiconductor and an electronic apparatus including the same.

BACKGROUND ART

A semiconductor light-emitting element employed as a display light source needs high light extraction efficiency and isotropic orientation. On the other hand, the semiconductor light-emitting element is sealed with light transmissive resin for the purpose of ensuring the reliability. A factor to lower the light extraction efficiency of such a semiconductor light-emitting element is light trapping due to total reflection on an interface between a light-emitting surface and a sealing resin of the semiconductor light-emitting element and an interface between the sealing resin and the air.

For example, for suppressing total reflection on the interface between the light-emitting surface and the sealing resin of the semiconductor light-emitting element and enhancing the light extraction efficiency, there is known a semiconductor light-emitting element in which a convexo-concave structure having triangular waves-shaped cross-section is formed on the light-emitting surface of the semiconductor light-emitting element (e.g., see Patent Literature 1).

Moreover, for suppressing total reflection on the interface between the sealing resin of the semiconductor light-emitting element and the air and enhancing the light extraction efficiency, there is known a semiconductor light-emitting element package in which a convexo-concave structure having triangular waves-shaped cross-section is formed on the light-emitting surface of the sealing resin (e.g., Patent Literature 2).

CITATION LIST

Patent Literature

Patent Literature 1: Japanese Patent Application Laid-open No. 2010-171341
Patent Literature 2: Japanese Patent Application Laid-open No. 2008-227456

DISCLOSURE OF INVENTION

Technical Problem

However, in accordance with the semiconductor light-emitting element described in Patent Literature 1, since a tilt angle of the emitting surface is discrete due to the concave-convex shape of the triangular waves-shaped cross-section formed on the light-emitting surface of the semiconductor light-emitting element, undulations are generated in the orientation of emission light. Moreover, if the tilt angle is not correctly selected, emission light that exceeds a critical angle of total reflection on the interface between the sealing resin and the air increases, the light is trapped inside the sealing resin, and the light extraction efficiency cannot be enhanced.

On the other hand, in accordance with the semiconductor light-emitting element package described in Patent Literature 2, the concave-convex shape formed on the light-emitting surface of the sealing resin causes scattering of external light reflection, and thus lowering of the contrast becomes a problem in a case where it is used as the display light source.

In view of the above-mentioned circumstances, it is an object of the present technology to provide a semiconductor light-emitting element and an electronic apparatus capable of enhancing the emission intensity and the orientation of emission light.

Solution to Problem

A semiconductor light-emitting element according to an embodiment of the present technology includes a first electrode, a second electrode, a light-emitting layer constituted by a semiconductor, and an optical functional film.

The light-emitting layer includes a first surface that is connected to the first electrode and has a first convexo-concave structure, a second surface that is connected to the second electrode, has a second convexo-concave structure, and is opposite to the first surface, and a peripheral surface that continuously connects the first surface and the second surface to each other.

The optical functional film coats the second surface and the peripheral surface and includes a reflecting layer capable of reflecting light emitted by the light-emitting layer.

In accordance with the semiconductor light-emitting element, a reflection direction of light on the second surface and an emission direction of light on the first surface can be adjusted, and thus emission light intensity and light distribution property can be enhanced.

The peripheral surface may be constituted by a taper surface.

With this configuration, light can be efficiently reflected toward the first surface inside the light-emitting layer.

The optical functional film may further include a first insulating layer formed between the light-emitting layer and the reflecting layer, and a second insulating layer formed on the reflecting layer.

In accordance with such a configuration, the first insulating layer can ensure insulation between the light-emitting layer and the reflecting layer and the second insulating layer can also enhance insulation between the light-emitting layer and the outside.

The second convexo-concave structure is not particularly limited, and typically includes at least one hemisphere, elliptical hemisphere, cone, truncated cone, pyramid, or truncated pyramid or a combination of two or more of them.

With this configuration, optical characteristics of the second surface can be adjusted and the orientation of emission light can be enhanced.

The first convexo-concave structure may include a prism having a ridge.

Alternatively, the first convexo-concave structure may include at least one hemisphere, elliptical hemisphere, cone, truncated cone, pyramid, or truncated pyramid or a combination of two or more of them.

With this configuration, optical characteristics of the first surface can be adjusted, and emission intensity of emission light can be enhanced also in an aspect in which the semiconductor light-emitting element is sealed with a resin.

The semiconductor light-emitting element may further include a light-transmissive sealing resin layer that coats the first surface.

With this configuration, the reliability of the semiconductor light-emitting element can be ensured.

A semiconductor light-emitting element according to another embodiment of the present technology includes a first electrode, a second electrode, a light-emitting layer constituted by a semiconductor, a first optical functional film, and a second optical functional film.

The light-emitting layer includes a first surface that is connected to the first electrode, a second surface that is connected to the second electrode, has a second convexo-concave structure, and is opposite to the first surface, a peripheral surface that continuously connects the first surface and the second surface to each other.

The first optical functional film coats the second surface and the peripheral surface and includes a reflecting layer capable of reflecting light emitted by the light-emitting layer.

The second optical functional film coats the first surface and limits an angle of emission of light from the first surface.

In accordance with the semiconductor light-emitting element, the reflection direction of the light on the second surface and the emission direction of the light on the first surface can be adjusted, and thus the emission light intensity and the light distribution property can be enhanced.

The peripheral surface may be constituted by a taper surface.

With this configuration, light can be efficiently reflected toward the first surface inside the light-emitting layer.

The first optical functional film may further include a first insulating layer formed between the light-emitting layer and the reflecting layer, and a second insulating layer formed on the reflecting layer.

In accordance with such a configuration, the first insulating layer can ensure insulation between the light-emitting layer and the reflecting layer and the second insulating layer can also enhance insulation between the light-emitting layer and the outside.

The convexo-concave structure is not particularly limited, and typically includes at least one hemisphere, elliptical hemisphere, cone, truncated cone, pyramid, or truncated pyramid or a combination of two or more of them.

With this configuration, optical characteristics of the second surface can be adjusted and the orientation of emission light can be enhanced.

The second optical functional film includes a dielectric multi-layer film or a diffractive optical element for example.

With this configuration, optical characteristics of the second surface can be adjusted and the emission intensity of emission light can be enhanced also in the aspect in which the semiconductor light-emitting element is sealed with a resin.

The semiconductor light-emitting element may further include a light-transmissive sealing resin layer that coats the first surface.

With this configuration, the reliability of the semiconductor light-emitting element can be ensured.

An electronic apparatus according to an embodiment of the present technology includes a substrate and at least one first semiconductor light-emitting element.

A driving circuit is formed on the substrate.

The first semiconductor light-emitting element includes a first electrode, a second electrode, a light-emitting layer constituted by a semiconductor, and an optical functional film.

The first and second electrodes are connected to the driving circuit.

The light-emitting layer includes a first surface that is connected to the first electrode and has a first convexo-concave structure, a second surface that is connected to the second electrode, has a second convexo-concave structure, and is opposite to the first surface, and a peripheral surface that continuously connects the first surface and the second surface to each other.

The optical functional film coats the second surface and the peripheral surface and includes a reflecting layer capable of reflecting light emitted by the light-emitting layer. The second surface is arranged on the substrate via the optical functional film.

The first semiconductor light-emitting element may include a plurality of first semiconductor light-emitting elements that emits red light. The electronic apparatus may further include: a plurality of second semiconductor light-emitting elements that is arranged on the substrate and emits blue light, and a plurality of third semiconductor light-emitting elements that is arranged on the substrate and emits green light.

An electronic apparatus according to another embodiment of the present technology includes a substrate and at least one first semiconductor light-emitting element.

A driving circuit is formed on the substrate.

The first semiconductor light-emitting element includes a first electrode, a second electrode, a light-emitting layer constituted by a semiconductor, a first optical functional film, and a second optical functional film.

The light-emitting layer includes a first surface that is connected to the first electrode, a second surface that is connected to the second electrode, has a second convexo-concave structure, and is opposite to the first surface, and a peripheral surface that continuously connects the first surface and the second surface to each other.

The first optical functional film coats the second surface and the peripheral surface and includes a reflecting layer capable of reflecting light emitted by the light-emitting layer.

The second optical functional film coats the first surface and limits an angle of emission of light from the first surface.

The second surface is arranged on the substrate via the optical functional film.

The first semiconductor light-emitting element may include a plurality of first semiconductor light-emitting elements that emits red light. The electronic apparatus may further include: a plurality of second semiconductor light-emitting elements that is arranged on the substrate and emits blue light; and a plurality of third semiconductor light-emitting elements that is arranged on the substrate and emits green light.

Advantageous Effects of Invention

As described above, in accordance with the present technology, the emission intensity and the orientation of emission light can be enhanced.

It should be noted that the effects described here are not necessarily limitative and any effect described in the present disclosure may be provided.

MODE(S) FOR CARRYING OUT THE INVENTION

Hereinafter, embodiments according to the present technology will be described with reference to the drawings.

First Embodiment

Figure 1:
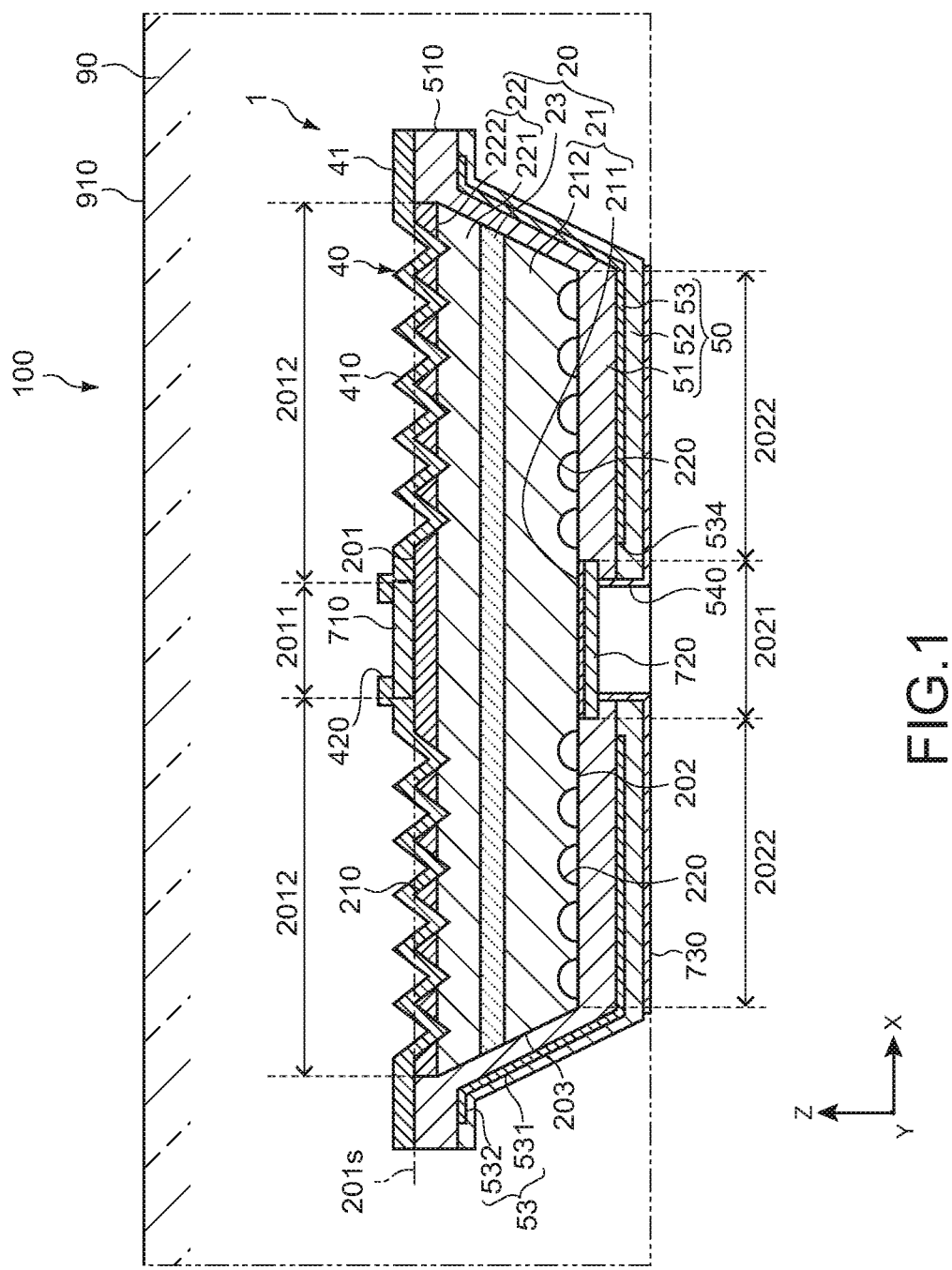
FIG. 1 A schematic cross-sectional view of a light-emitting apparatus including a semiconductor light-emitting element according to a first embodiment of the present technology.

FIG. 1 is a schematic cross-sectional view of a light-emitting apparatus 100 including a semiconductor light-emitting element 1 according to a first embodiment of the present technology. Hereinafter, a configuration of the semiconductor light-emitting element 1 according to this embodiment will be described.

It should be noted that in the figures, the X-axis and the Y-axis denote directions orthogonal to each other (in-plane directions of the semiconductor light-emitting element 1) and the Z-axis denotes a direction (a direction of thickness of the semiconductor light-emitting element 1, that is, upper and lower directions) orthogonal to the X-axis and the Y-axis.

[Semiconductor Light-Emitting Element]

The light-emitting apparatus 100 according to this embodiment includes the semiconductor light-emitting element 1 and a sealing resin layer 90 that seals the semiconductor light-emitting element 1.

The semiconductor light-emitting element 1 is constituted by a light-emitting diode (LED) having a laminate structure of a semiconductor compound. The size of the semiconductor light-emitting element 1 can be adjusted as appropriate in a manner that depends on a configuration or the like of an electronic apparatus on which the semiconductor light-emitting element 1 is to be mounted. For example, a length in a X-axis direction can be 1 μm or more and 300 μm or less, a length in a Y-axis direction can be 1 μm or more and 300 μm or less, and a length in a Z-axis direction can be 1 μm or more and 20 μm or less.

The semiconductor light-emitting element 1 includes a first electrode 710, a second electrode 720, a light-emitting layer 20, and an inorganic film 40, and a first optical functional film 50 and the surface and the periphery are sealed with the sealing resin layer 90.

The light-emitting layer 20 includes a first surface 201 that is connected to the first electrode 710, a second surface 202 that is connected to the second electrode 720, and a peripheral surface 203 that continuously connects the first surface 201 and the second surface 202 to each other, and is constituted by a semiconductor.

The inorganic film 40 functions as an inorganic insulation film that coats the first surface 201.

The first optical functional film 50 functions as an optical functional film including a reflecting layer 53 capable of reflecting light emitted by the light-emitting layer 20.

Hereinafter, the respective elements of the semiconductor light-emitting element 1 will be described.

(Light-Emitting Layer)

The light-emitting layer 20 is in this embodiment constituted by a laminate structure of a semiconductor that emits red light and includes a GaAs-based or AlGaInP-based semiconductor compound for example. The light-emitting layer 20 includes a first semiconductor layer 21 having a first electrical conduction type, an active layer 23 formed on the first semiconductor layer 21, and a second semiconductor layer 22 having a second electrical conduction type formed on the active layer 23. In this embodiment, it is assumed that the first electrical conduction type is an n-type and the second electrical conduction type is a p-type, though not limited thereto.

The first surface 201 and the second surface 202 are arranged to be opposite to each other in the Z direction. The total thickness of the light-emitting layer 20 is 1 μm or more and 20 μm or less for example.

The shape of the light-emitting layer 20 is not particularly limited. For example, the first surface 201 is formed to be larger than the second surface 202 in a planar view as viewed in the Z-axis direction and is configured in a square truncated pyramid. In this case, the area of a cross-section orthogonal to the Z-axis direction is configured to gradually increase toward the first surface 201 from the second surface 202 and the peripheral surface 203 is configured to include four taper surfaces.

The first surface 201 includes a connection region 2011 in which the first electrode 710 is formed and light extraction regions 2012 in which first convexo-concave structures 210 are formed. The connection region 2011 occupies a center portion of the first surface 201 and the light extraction regions 2012 are formed surrounding the connection region 2011. Although the position and the shape of the connection region 2011 are not limited, the connection region 2011 may be formed in a circular shape, an elliptical shape, or a rectangular shape for example or a plurality of connection regions 2011 may be arranged in island shapes.

The first convexo-concave structures 210 can be configured as appropriate to obtain desired optical characteristics of emission light. In this embodiment, first structures 210 have a structure in which a plurality of prism-shaped structures having ridges parallel to the Y-axis direction is arranged in the X-axis direction as shown in FIG. 1. The first structures 210 are not limited thereto, and may have a shape in which at least one hemisphere, elliptical hemisphere, cone, truncated cone, pyramid, truncated pyramid, or a combination of two or more of them is arranged in a two-dimensional form. The number of first convexo-concave structures 210, the size, the arrangement pitch, and the like are also not particularly limited and can be selected as appropriate to obtain desired optical characteristics.

The first surface 201 is substantially orthogonal to the Z-axis direction. "The first surface 201 is substantially orthogonal to the Z-axis direction" means that a reference surface 201s of the first surface 201 is substantially orthogonal to the Z-axis direction. As shown in FIG. 1, the reference surface 201s of the first surface 201 corresponds to a virtual plane constituted by apexes (top faces) of a plurality of convex portions that constitute the first convexo-concave structures 210.

The second surface 202 includes a connection region 2021 in which the second electrode 720 is formed and reflection regions 2022 in which second convexo-concave structures 220 are formed. The connection region 2021 occupies a center portion of the second surface 202 and the reflection regions 2022 are arranged surrounding the connection region 2021. The reflection regions 2022 are coated by the first optical functional film 50.

The second convexo-concave structures 220 can be configured as appropriate to obtain desired optical characteristics of emission light. In this embodiment, the second structures 220 have a structure in which a plurality of hemisphere-shaped recess portions is arranged in a two-dimensional form inside the second surface 202 as shown in FIG. 1. The second structures 220 are not limited thereto, and may have a shape in which at least one hemisphere, elliptical hemisphere, cone, truncated cone, pyramid, truncated pyramid, or a combination of two or more of them is arranged in a two-dimensional form. The number of second convexo-concave structures 220, the size, the arrangement pitch, and the like are also not particularly limited and can be selected as appropriate to obtain desired optical characteristics.

In this embodiment, the individual hemisphere-shaped recess portions that constitute the second structures 220 are filled with a constituent material of a first insulating layer 51 that constitutes the first optical functional film 50. The present technology is not limited thereto, and the inside of the recess portion may be filled with a material other than the constituent material of the first insulating layer 51.

Light emitted by the active layer 23 is emitted to the light-emitting layer 20 via the light extraction regions 2012 of the first surface 201. In this embodiment, the taper-shaped peripheral surface 203 is coated with the reflecting layer 53 of the first optical functional film 50, the light extraction regions 2012 of the first surface 201 have the first convexo-concave structures 210, and the light extraction regions 2022 of the second surface 202 further have the second convexo-concave structures 220. With this configuration, by reflecting the light upward in the Z-axis direction, the emission efficiency can be enhanced and the light orientation can be controlled. In the following description, "upward in the Z-axis direction" will be also referred to as a forward direction of the semiconductor light-emitting element 1.

The first semiconductor layer 21 has a laminate structure of a first contact layer 211 and a first cladding layer 212.

The first contact layer 211 is connected to the second electrode 720 and has an area substantially identical to the second electrode 720 as viewed in the Z-axis direction for example. The first contact layer 211 is constituted by a material that can be held in ohmic contact with the second electrode 720 and includes GaAs of an n-type for example.

The first cladding layer 212 is formed on the first contact layer 211 and configured to occupy the entire second surface 202 of the light-emitting layer 20 as viewed in the Z-axis direction. That is, an exposed surface of the first cladding layer 212 constitutes the reflection regions 2022 of the second surface 202. The first cladding layer 212 includes AlGaInP of an n-type for example.

The active layer 23 includes a multi-quantum well structure of a well layer and a barrier layer respectively formed of semiconductors having different compositions for example and is configured to be capable of emitting light having a predetermined wavelength. The active layer 23 according to this embodiment is capable of emitting red light having a wavelength of light emission of approximately 500 to 700 nm. The active layer 23 is constituted by a well layer having approximately 10 to 20 layers including GaInP for example and a barrier layer having approximately 10 to 20 layers including AlGaInP and the well layer and the barrier layer are stacked on each other.

The second semiconductor layer 22 has a laminate structure of a second cladding layer 221 and a second contact layer 222. The second cladding layer 221 includes AlGaInP of a p-type formed on the active layer 23 for example. The second contact layer 222 is formed on the second cladding layer 221 and connected to the first electrode 710. The second contact layer 222 occupies the entire first surface 201 of the light-emitting layer 20 as viewed in the Z-axis direction and an exposed surface on which the first electrode 710 is not formed constitutes the light extraction regions 2012 of the first surface 201. The second contact layer 222 is constituted by a material that can be held in ohmic contact with the first electrode 710 and includes GaP of a p-type for example.

Another layer other than the active layer 23 may be provided between the first and the second semiconductor layers 21 and 22. For example, an undoped protection layer including AlGaInP may be provided between the active layer 23 and the second cladding layer 221 for example. The protection layer can prevent from being diffused toward the dopant active layer 23 such as the second cladding layer 221. Moreover, the material shown in each layer of the light-emitting layer 20 is exemplary and can be selected as appropriate in view of a configuration of the light-emitting element 1, desired light emission characteristics, and the like.

The first electrode 710 is formed in the connection region 2011 of the first surface 201 of the light-emitting layer 20 and electrically connected to the second contact layer 222. The shape of the first electrode 710 is not particularly limited, and is constituted by an elliptical shape whose short axis length in the X-axis direction is approximately 1 to 10 μm and whose long axis length in the Y-axis direction is approximately 1 to 10 μm for example, a circular shape, a rectangular shape, or the like. The thickness of the first electrode 710 can be 0.2 to 0.6 μm for example. The first electrode 710 is constituted by for example a metal material such as Ti, Pt, Au, Ge, Ni, and Pd, an alloy or laminate including them, a transparent conducting material such as ITO, or the like.

The second electrode 720 is formed in the connection region 2021 of the second surface 202 of the light-emitting layer 20 and electrically connected to the first contact layer 211. The shape of the second electrode 720 is not particularly limited. Although the second electrode 720 is configured in a circular shape for example, the second electrode 720 may be configured in an elliptical shape, a rectangular shape, or the like. The thickness of the second electrode 720 can be 0.2 to 0.6 μm for example. The second electrode 720 is constituted by for example a metal material such as Ti, Pt, Au, Ge, Ni, and Pd, an alloy or laminate including them, a transparent conducting material such as ITO, or the like.

(Inorganic Film)

The inorganic film 40 is configured to coat the light extraction regions 2012 of the first surface 201 of the light-emitting layer 20. That is, the inorganic film 40 is formed on the first electrode 710 (the connection region 2011) and includes a connection hole 420 facing the first electrode 710. The thickness of the inorganic film 40 is not particularly limited, and is 0.2 μm or more and 0.6 μm or less, more favorably 0.3 μm or more and 0.5 μm or less for example.

The inorganic film 40 includes convexo-concave portions 410 each having a shape corresponding to each of the first convexo-concave structures 210 and a first end portion 41 formed at peripheral rims of the convexo-concave portions 410. The first end portion 41 is a flat surface parallel to the first surface 201 of the light-emitting layer 20 and protrudes outward from a peripheral portion of the first surface 201. "The flat surface parallel to the first surface 201" refers to a surface parallel to the reference surface 201s of the first surface 201.

The inorganic film 40 is light transmissive and constituted by silicon nitride (hereinafter, referred to as SiN) whose refractive index is 1.9 or more and 2.3 or less for example, a silicon oxide such as $SiO_2$, a laminate of SiN and $SiO_2$, or the like. Alternatively, the inorganic film 40 may be constituted by an insulating material such as TiN and $TiO_2$. With this configuration, insulation of the first surface 201 of the light-emitting layer 20 can be ensured and the inorganic film 40 can be made to function as a protection film for the first surface 201.

(First Optical Functional Film)

The first optical functional film 50 is configured to coat, as a whole, the second surface 202 and the peripheral surface 203 of the light-emitting layer 20. The first optical functional film 50 reflects light emitted from the light-emitting layer 20 toward the first surface 201 to thereby contribute to enhancement of the emission efficiency.

Specifically, the first optical functional film 50 is configured to coat the reflection regions 2022 on the second surface 202 and configured to coat the entire peripheral surface 203. The thickness of the first optical functional film 50 on the second surface 202 is not particularly limited, and is 0.1 μm or more for example. The thickness of the region along the peripheral surface 203 is also not particularly limited, and 0.1 μm or more for example.

Furthermore, the first optical functional film 50 includes a second end portion 510 that protrudes outward from the light-emitting layer 20. In this embodiment, the second end portion 510 protrudes from a peripheral portion of the first surface 201 of the light-emitting layer 20 in a direction parallel thereto. That is, the second end portion 510 is configured as a flange portion of the first optical functional film 50, which forms a base layer of the first end portion 41 of the inorganic film 40. The thickness of the second end portion 510 is not particularly limited, and is 0.2 μm or more and 0.5 μm or less for example.

The first optical functional film 50 includes the reflecting layer 53 capable of reflecting light emitted by the light-emitting layer 20, the first insulating layer 51 formed between the light-emitting layer 20 and the reflecting layer 53, and a second insulating layer 52 formed on the reflecting layer 53. That is, the first optical functional film 50 has a structure in which the first insulating film layer 51, the reflecting layer 53, and the second insulating layer 52 are stacked in the stated order on the light-emitting layer 20.

The first insulating layer 51 coats a region from the reflection regions 2022 of the second surface 202 to the peripheral surface 203 and constitutes a main part of the second end portion 510. On the other hand, the second insulating layer 52 is formed in a region that overlaps the first insulating layer 51 as viewed in the Z-axis direction. The constituent materials of the first and second insulating layers 51 and 52 is not particularly limited, and is constituted by a silicon oxide such as $SiO_2$, SiN, TiN, $TiO_2$, another inorganic insulation material, or a laminated film of them for example.

The reflecting layer 53 includes an aperture 534 bigger than a connection hole 540 to be described later and is formed by being sandwiched by the first and the second insulating layers 51 and 52. The reflecting layer 53 has a function of reflecting light emitted from the light-emitting layer 20 toward the first surface 201. The reflecting layer 53 is constituted by a material having high reflection efficiency of light emitted from the light-emitting layer 20 and is constituted by a metal material such as Al, Au, Ti, Cu, Ni, and Ag for example, an alloy or laminate thereof, or the like.

The reflecting layer 53 is formed by being sandwiched by the first and the second insulating layers 51 and 52. With this configuration, the reflecting layer 53 is ensured by insulation between the light-emitting layer 20 and the outside of the semiconductor light-emitting element 1. That is, the reflecting layer 53 is held in an electrically flowing state.

The reflecting layer 53 includes a first region 531 that coats the second surface 202 and the peripheral surface 203 of the light-emitting layer 20 and a second region 532 that protrudes from the first region 531 outward with respect to a peripheral portion of the light-emitting layer 20. The second region 532 is configured as a region formed inside the second end portion 510 and formed protruding in a direction parallel to the first surface 201 (the reference surface 201s of the first surface 201). Since the reflecting layer 53 includes the second region 532, the reflecting layer 53 is capable of reflecting and emitting light, which has entered the first end portion 41, upward along the Z-axis. With this configuration, the emission light intensity in the forward direction can be enhanced. The first and second end portions 41 and 510 each include an end surface parallel to the Z-axis direction and those end surfaces are formed in an identical plane.

(External Connection Terminal)

An external connection terminal 730 is formed on a surface of the second insulating layer 52 (a lower surface in FIG. 1). The external connection terminal 730 is electrically connected to the second electrode 720 via an inner wall surface of the connection hole 540 that penetrates the first and the second insulating layers 51 and 52. An inner peripheral surface of the connection hole 540 is constituted by the first and the second insulating layers 51 and 52 and the reflecting layer 53 is not exposed. With this configuration, electrical insulation between the reflecting layer 53 and the second electrode 720 and the external connection terminal 730 is ensured.

The external connection terminal 730 is formed in a rectangular shape for example as viewed in the Z-axis direction. The thickness of the external connection terminal 730 is not particularly limited, and is 0.1 µm or more and 0.5 µm or less for example. The external connection terminal 730 is formed of a metal material such as Al, Au, and Ti or an alloy or laminate including them.

(Sealing Resin Layer)

The sealing resin layer 90 is constituted by a light transmissive resin material that coats the first surface 201 of the light-emitting layer 20. The semiconductor light-emitting element 1 is mounted on a substrate (not shown) including a driving circuit and the sealing resin layer 90 is formed to seal the surface of the substrate or the periphery of the substrate together with the semiconductor light-emitting element 1. With this configuration, the semiconductor light-emitting element 1 and the driving circuit can be prevented from being exposed to the external air and their reliability can be ensured.

The sealing resin layer 90 is typically constituted by a light transmissive resin material having a suitable refractive index, for example, an acryl-based resin material. A surface 910 of the sealing resin layer 90 held in contact with the air forms a light-emitting surface of the light-emitting apparatus 100 and is typically a plane parallel to the XY-plane. With this configuration, scattering of external light reflection on the surface 910 can be suppressed, and thus lowering of image contrast can be suppressed in a case where the semiconductor light-emitting element 1 is used as a light source for a display or the like.

The semiconductor light-emitting element 1 having the configuration as described above includes a first optical functional film 50 including the reflecting layer 53 that coats the second surface 202 and the peripheral surface 203 of the light-emitting layer 20. With this configuration, light emitted from the active layer 23 toward the second surface 202 and the peripheral surface 203 is reflected by the first region 531 of the reflecting layer 53 and is emitted in the forward direction via the light extraction regions 2012. Light entering the first end portion 41 of the inorganic film 40 is also reflected by the second region 532 of the reflecting layer 53. Therefore, the emission efficiency in the forward direction can be enhanced.

In addition, as described below, also with the first and second convexo-concave structures 210 and 220, the emission efficiency in the forward direction can be enhanced. Specifically, the first convexo-concave structures 210 can provide desired light emission intensity, and the second convexo-concave structures 220 can provide a desired light distribution property.

(Action of First Convexo-Concave Structure)

Figure 2:
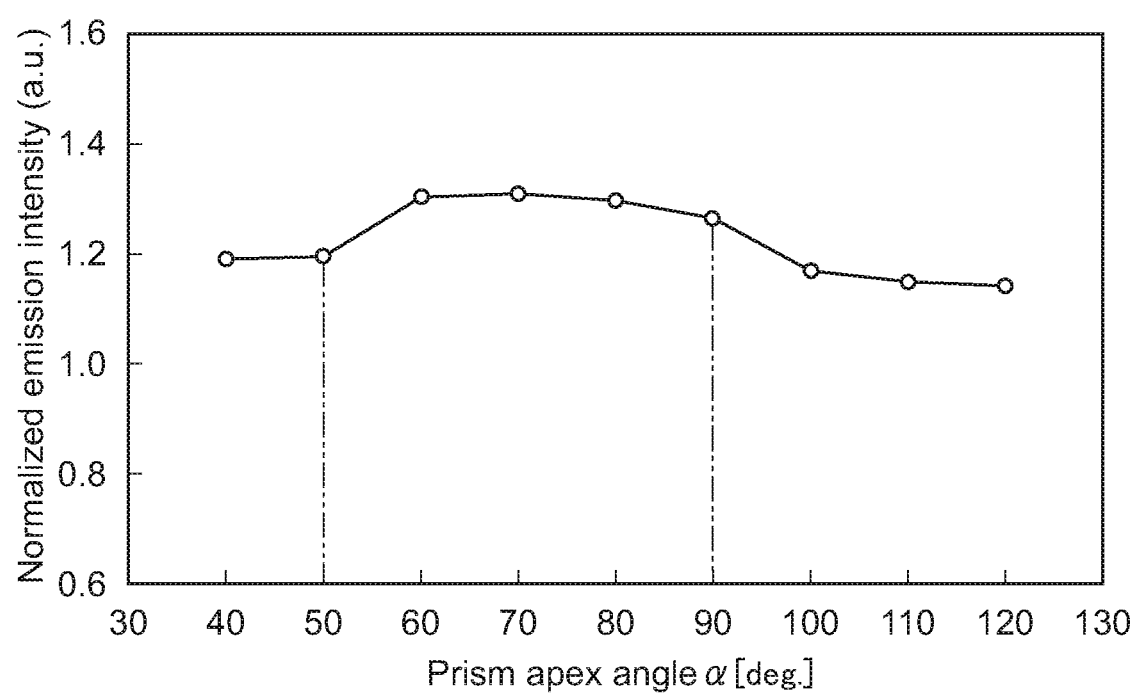
FIG. 2 A graph showing emission intensity of emission light in an aspect in which the semiconductor light-emitting element is sealed with sealing resin.

FIG. 2 is a graph showing emission intensity of emission light in an aspect in which the semiconductor light-emitting element 1 is sealed with an acryl-based sealing resin layer 90 (having a refractive index of 1.498) as an example of this embodiment. In this embodiment, the first convexo-concave structures 210 are constituted by one-dimensional prism shapes having ridges. The horizontal axis in FIG. 2 indicates a prism apex angle α and the vertical axis indicates the emission intensity in the forward direction (normalized intensity in a case where the intensity in a comparative example with no first convexo-concave structures is 1).

As shown in FIG. 2, by providing the first surface 201 of the light-emitting layer 20 with the first convexo-concave structures 210, the emission intensity in the forward direction can be enhanced as compared to the comparative example. In particular, in a case where the prism apex angle α is 50° or more and 90° or less, the emission intensity 1.2 times as high as that of the comparative example can be obtained. The prism apex angle α is more favorably 60° or more and 80° or less.

It is desirable that the prism apex angle α be designed as appropriate so as to enhance the emission efficiency in the forward direction in a manner that depends on purposes, specifications, and the like. Hereinafter, actions of the apex angle α of the prism shape will be described below.

Figure 3A:
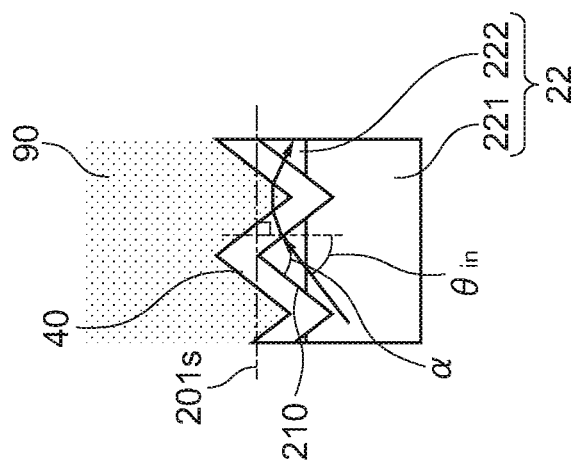
FIGS. 3A, 3B, and 3C Schematic diagrams for describing an emission light direction control action of a first convexo-concave structure in the semiconductor light-emitting element.
Figure 3B:
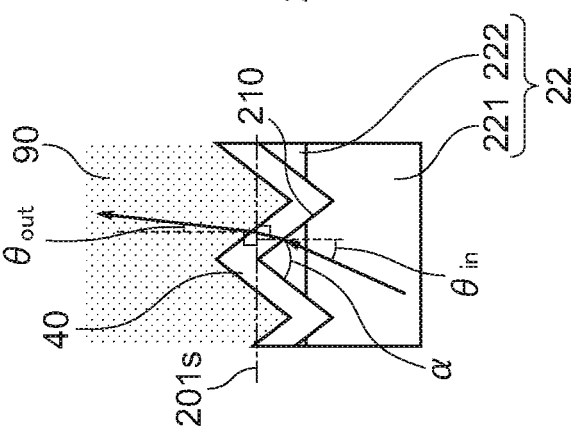
Figure 3C:
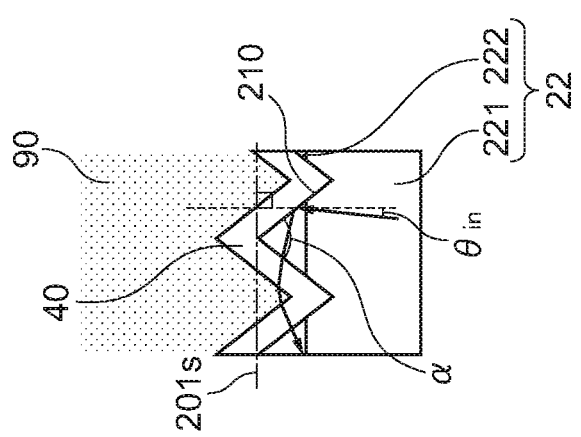

FIGS. 3A, 3B, and 3C are schematic diagrams for describing an emission light direction control action of the first convexo-concave structures 210 constituted by the one-dimensional prism shapes having the ridges in the example of this embodiment. In the figure, the arrow shows the trajectory of a light beam. The angle of incidence $\theta_{in}$ indicates an angle formed by a normal-line direction of the reference surface 201s of the first surface 201 and a light beam direction of incident light. The angle of emission $\theta_{out}$ indicates an angle formed by the normal-line direction of the reference surface 201s and the light beam direction of the emission light.

As shown in FIG. 3B, incident light, which has entered the first convexo-concave structures 210 at the angle of incidence $\theta_{in}$, is converted into the angle of emission $\theta_{out}$ and emitted from the first convexo-concave structures 210. This angle conversion due to reflection is expressed by Expression 1 below on the basis of the prism apex angle α, a refractive index Nin of the second semiconductor layer 22, and a refractive index Nout of the sealing resin layer 90.

[Expression 1]

$$\theta_{out} = \left(90° - \frac{\alpha}{2}\right) - \sin^{-1}\left\{\frac{N_{out}}{N_{in}}\sin\left(90° - \frac{\alpha}{2} - \theta_{in}\right)\right\} \quad (1)$$

Figure 4:
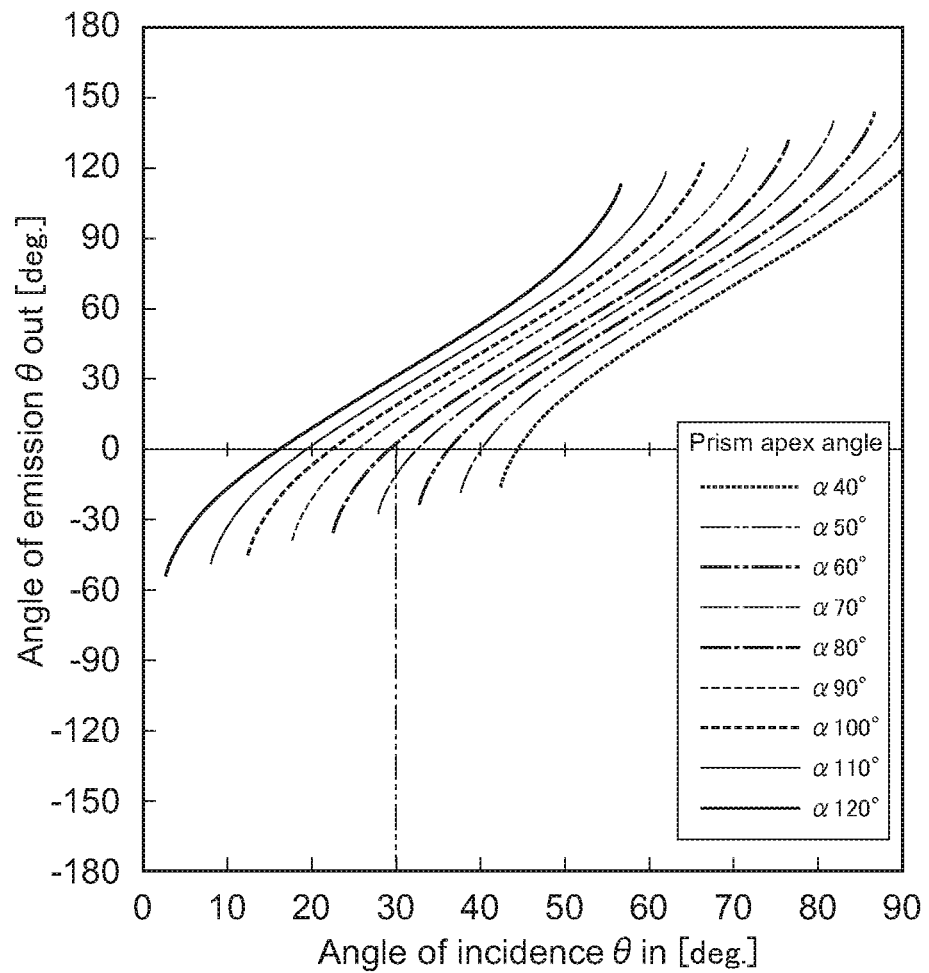
FIG. 4 A graph showing the emission light direction control action of the first convexo-concave structure.

FIG. 4 is a graph showing the emission light direction control action of the first convexo-concave structures 210 constituted by one-dimensional prism shapes having ridges in carrying out this embodiment. The horizontal axis indicates the angle of incidence $\theta_{in}$ and the vertical axis indicates the angle of emission $\theta_{out}$. Furthermore, FIG. 4 shows results when the prism apex angle α is changed from 40° to 120° in units of 10°.

For example, in a case where the prism apex angle α is selected to be 80°, it can be seen that when the angle of incidence $\theta_{in}$ is approximately 30°, the angle of emission $\theta_{out}$ is approximately 0°, i.e., light is erected and emitted in the forward direction. Moreover, when the angle of incidence $\theta_{in}$ is 22° or less or 77° or more, the incident light is returned to the second semiconductor layer 22 by total reflection and re-used as shown in each of FIGS. 3A and 3C.

Figure 5:
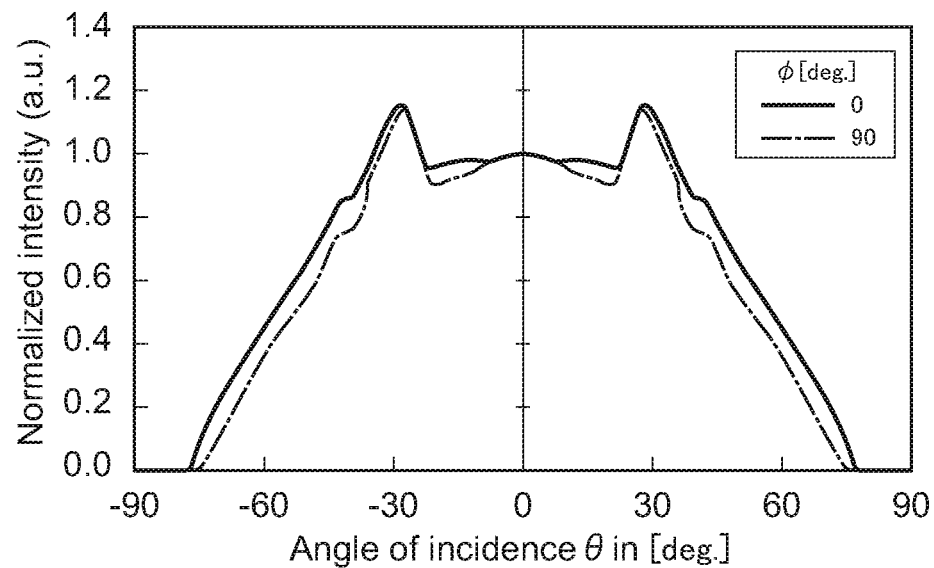
FIG. 5 A graph showing an angle intensity distribution in which light emitted from an active layer enters the first convexo-concave structure from a plurality of directions orthogonal to a normal-line direction of a first surface in the semiconductor light-emitting element.

FIG. 5 is a graph showing an angle intensity distribution (NFP; Near Field Pattern) in which the light emitted from the active layer 23 enters the first convexo-concave structures 210 on the basis of the plurality of directions orthogonal to the normal-line direction of the first surface 201 of the light-emitting layer 20 (in a direction parallel to the Z-axis direction). The horizontal axis indicates the angle of incidence $\theta_{in}$ (the angle formed by the normal-line direction of the reference surface 201s of the first surface 201 and the light beam direction of the incident light) and the vertical axis indicates the intensity of the incident light (the normalized intensity where the intensity of $\theta_{in}$=0° is 1). At this time, light emitted from the active layer 23 includes not only an optical path in which the light travels from the active layer 23 directly toward the first surface 201 but also the optical path in which the light is reflected by the reflecting layer 53 and travels toward the first surface 201. However, the NFP provides results obtained by counting both. It should be noted that the optical path in which light is totally reflected once by the first convexo-concave structures 210 and re-used is not taken into consideration.

Figure 6:
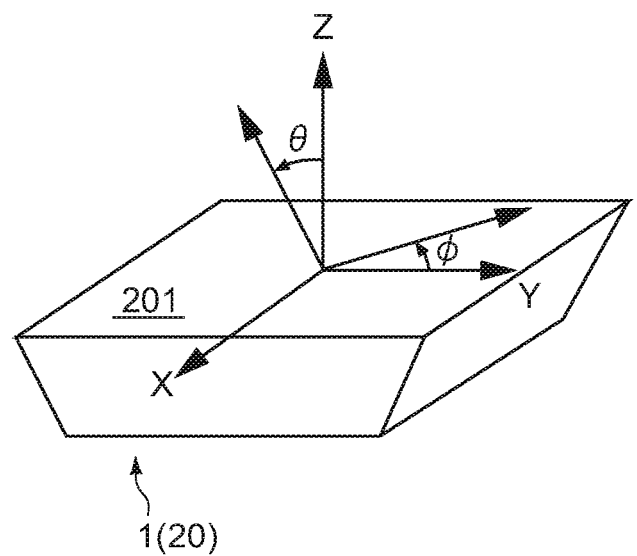
FIG. 6 A schematic diagram for describing an angle of incidence in the graph of FIG. 5 and an angle associated with a direction in which incident light is viewed.

FIG. 6 is a schematic diagram for describing the angle of incidence $\theta_{in}$ in the graph of FIG. 5 and an angle $\phi_{in}$ associated with a direction in which the incident light is viewed. As shown in FIG. 6, the angle of incidence $\theta_{in}$ is an angle from a normal-line direction of an incident surface, and indicates an angle from the Z-axis direction orthogonal to the first surface 201 in this embodiment. Moreover, in a case where a certain direction (e.g., the Y-axis direction) parallel to the first surface 201 that is the incident surface is used as a reference direction (0°), a direction in which incident light is viewed is defined by the angle $\phi_{in}$ from the reference direction in the XY-plane parallel to the first surface 201. That is, in the graph of FIG. 5, results in which $\phi$in=0° and the emission light is viewed at an angle of 90°.

Figure 7:
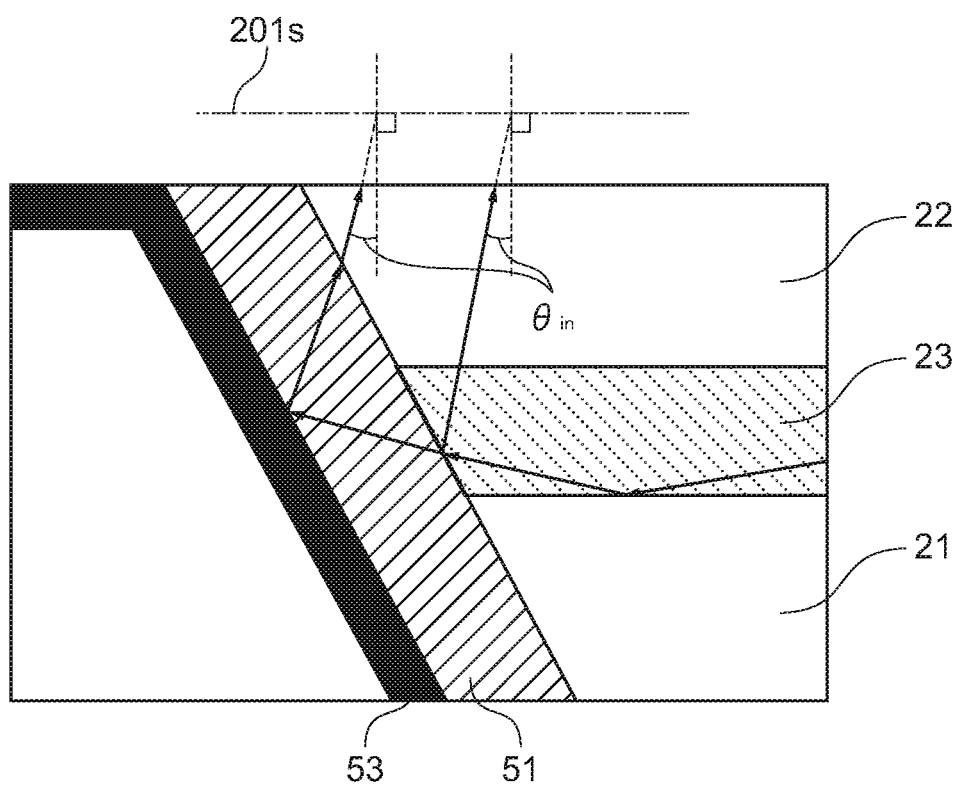
FIG. 7 A schematic diagram for describing an optical path on which a light beam of light emitted from the active layer, which is totally reflected and guided inside the active layer, is reflected by a first optical functional film.

FIG. 7 is a schematic diagram for describing an optical path in which a light beam of the light emitted from the active layer 23, which is totally reflected and guided inside the active layer 23, is reflected by the first optical functional film 50.

Referring to FIG. 5, in both the NFP, angle intensity at an angle of incidence $\theta_{in}$=about ±30° is higher. It is because since the refractive index of the active layer 23 is higher than that of the first and the second semiconductor layers 21 and 22, relatively larger number of light beams of the light emitted from the active layer 23 as shown in FIG. 7, which is totally reflected and guided inside the active layer 23, and when those are reflected by the first optical functional film 50 including the reflecting layer 53, the angle intensity at the angle of incidence $\theta_{in}$=about ±30° is higher. The angle of incidence $\theta_{in}$ at which the angle intensity is higher varies depending on a tilt angle of the reflecting layer 53, i.e., a taper angle of the peripheral surface 203 of the light-emitting layer 20.

Therefore, when the angle intensity at the angle of incidence $\theta_{in}$=about ±30° in the NFP is higher as shown in FIG. 5, it is sufficient that the prism apex angle α is selected to be 80° to provide the angle of emission $\theta_{out}$=0° with respect to the angle of incidence $\theta_{in}$=±30° on the basis of Expression (1) as shown in FIG. 4. The emission efficiency in the forward direction can be enhanced by adjusting the emission light direction control action of the first convexo-concave structures 210 in a manner that depends on the tilt angle of the reflecting layer 53 in this manner.

(Action of Second Convexo-Concave Structure)

On the other hand, the orientation of emission light of the semiconductor light-emitting element 1 can be adjusted by the second convexo-concave structures 220 formed on the second surface 202 of the light-emitting layer 20. Hereinafter, the action regarding the orientation of emission light of the second convexo-concave structures 220 will be described.

Figure 8:
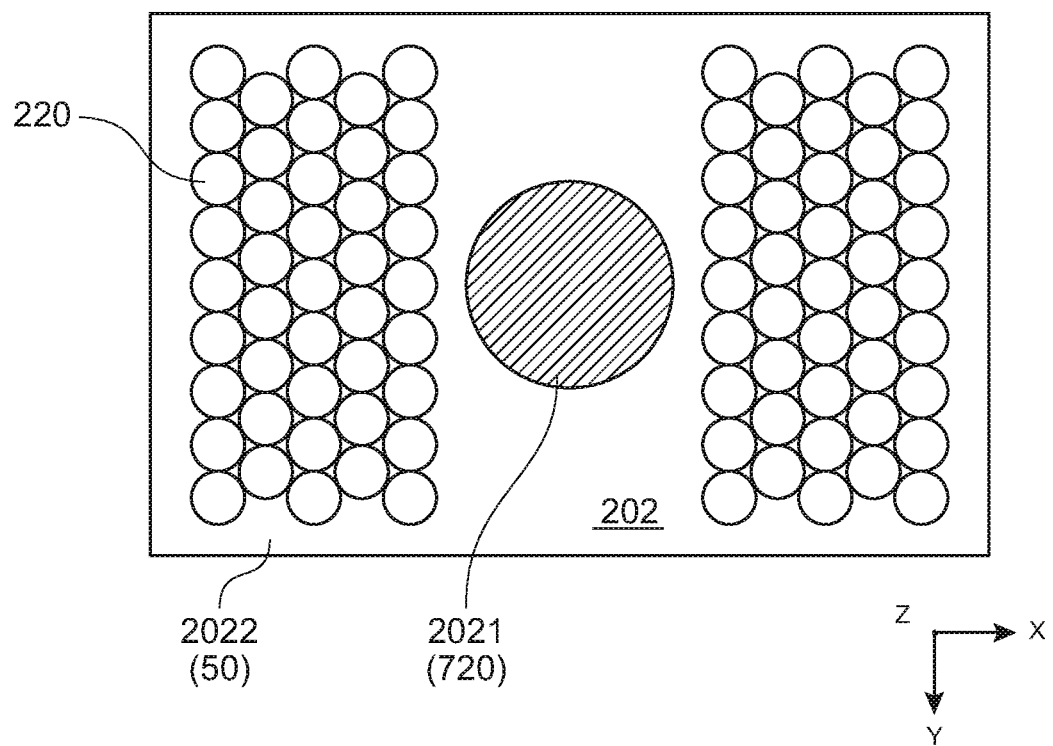
FIG. 8 A schematic plan view as a second surface in the semiconductor light-emitting element is viewed in a Z-axis direction.

FIG. 8 is a schematic plan view as the second surface 202 is viewed in the Z-axis direction in an example of this embodiment. The reflection regions 2022 are arranged surrounding the connection region 2021 in which the second electrode 720 is formed on the second surface 202. A plurality of hemisphere-shaped second convexo-concave structures 220 is arranged in a hexagonal lattice form in the reflection regions 2022. Moreover, the reflection regions 2022 are coated with the first optical functional film 50.

Figure 9:
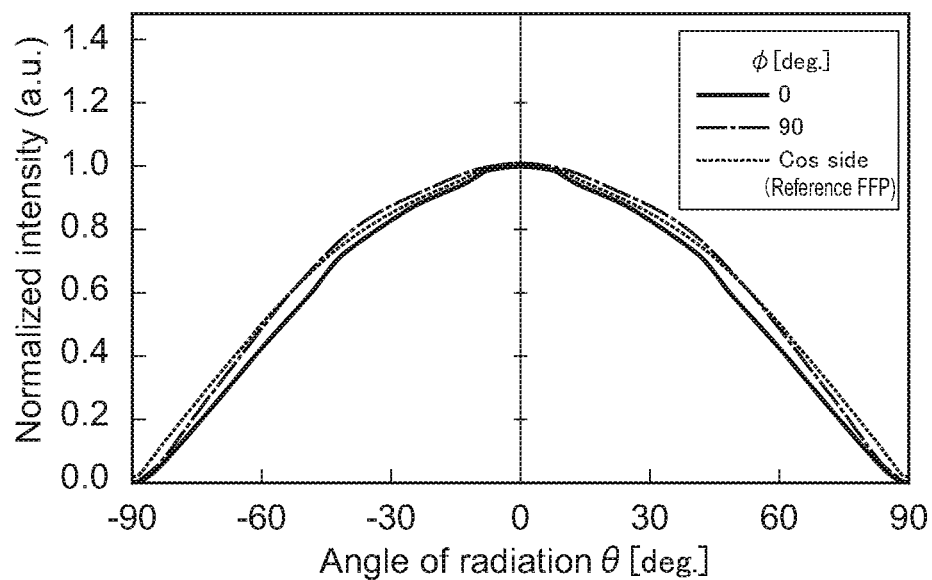
FIG. 9 A graph showing a radiation intensity distribution as emission light is viewed in a plurality of directions orthogonal to a normal-line direction of the first surface in the semiconductor light-emitting element.
Figure 10:
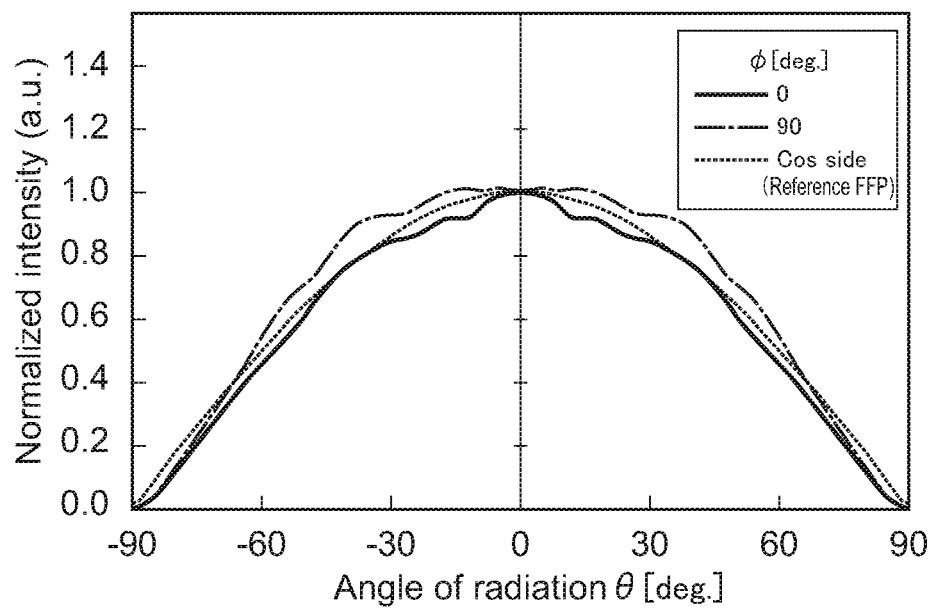
FIG. 10 A graph showing a radiation intensity distribution as emission light is viewed in a plurality of directions orthogonal to a normal-line direction of the first surface in a comparative example of the semiconductor light-emitting element.

FIGS. 9 and 10 are graphs each showing a radiation intensity distribution (FFP; Far Field Pattern) as emission light is viewed in a plurality of directions orthogonal to the normal-line direction of the first surface 201 (in a direction parallel to the Z-axis direction). The horizontal axis indicates an angle of radiation θ and the vertical axis indicates radiation light intensity (normalized intensity where the intensity of θ=0° is 1). FIG. 9 shows a result in this embodiment in which the second surface 202 has the second convexo-concave structures 220 and FIG. 10 shows a result in a comparative example in which the second surface 202 does have the second convexo-concave structure.

Here, the angle of radiation θ in the graphs of FIGS. 9 and 10 and the angle φ associated with the direction in which the emission light is viewed will be described with reference to FIG. 6 again. As shown in FIG. 6, the angle of radiation θ is an angle from a normal-line direction of the emitting surface and indicates an angle from the Z-axis direction orthogonal to the first surface 201 in this embodiment. Moreover, when a certain direction (e.g., the Y-axis direction) parallel to the first surface 201 that is the emitting surface is used as the reference direction (0°), the direction in which the emission light is viewed is defined by the angle φ from the reference direction in the XY-plane parallel to the first surface 201. That is, in the graphs of FIGS. 9 and 10, results in which φ=0° and the emission light is viewed at an angle of 90°.

Referring to FIG. 9, both the FFPs show substantially constant shapes irrespective of the angle φ. On the other hand, referring to FIG. 10, a difference in the FFPs at the respective angles φ is shown unlike the result of FIG. 9.

Here, in general, the FFP of the emission light is favorably Lambertian. The Lambertian indicates a state of the FFP of the emission light and refers to a luminous intensity distribution in which the FFP of the emission light on a certain emitting surface takes a constant value irrespective of the angle φ at which the emission light is viewed in a case where it is divided by a cosine (cos θ) related to the angle of radiation θ. For example, in a case where the FFP of the emission light is Lambertian, it can be seen that maximum radiation intensity is provided in the forward direction (θ=0°) and the radiation intensity tends to lower as the absolute value of a radiation angle θ increases. By setting to the FFP of the emission light to be Lambertian, the viewing angle dependency of the emission light can be lowered and emission light that is uniform as viewed in any direction can be provided. FIGS. 9 and 10 each show an FFP (hereinafter, referred to as reference FFP) that takes constant value when it is divided by cos θ for reference.

That is, regarding the FFP shown in FIG. 10, undulations are prominent at some angles θ at which the emission light is viewed, and it cannot be said that the Lambertian property is favorable. Meanwhile, regarding the FFP shown in FIG. 9, both shows a shape similar to that of the reference FFP, and it can be said that the Lambertian property is favorable. It is because due to the square truncated pyramid configuration of the light-emitting layer 20, the graph of FIG. 10 shows a peak resulting from the structure. In contrast, since the second surface 202 has the second convexo-concave structures 220 and a random property is added when light is reflected on the hemisphere-shaped surface, the orientation of emission light is isotropic in the graph of FIG. 9. Therefore, it has been confirmed that with the second convexo-concave structures 220, the viewing angle dependency of the light emission intensity can be lowered, the FFP can be set to be ideal Lambertian, and the light distribution property of the emission light can be enhanced.

It should be noted that in this embodiment, the second convexo-concave structures 220 each have the hemisphere shape, though the shape is not limited thereto. An elliptical hemisphere, cone, truncated cone, pyramid, or truncated pyramid shape may be employed. Moreover, the second convexo-concave structures 220 are arranged in the hexagonal lattice form, though the direction and type of arrangement are not limited thereto. It should be noted that the arrangement density is desirably increased to prevent flat regions from being left in the reflection regions 2022 as much as possible. In addition, although the regions in which the second convexo-concave structures 220 are arranged are arranged in two island shapes on the left- and right-hand sides of the connection region 2021, the second convexo-concave structures 220 may be continuously arranged in the entire reflection regions 2022.

Figure 11:
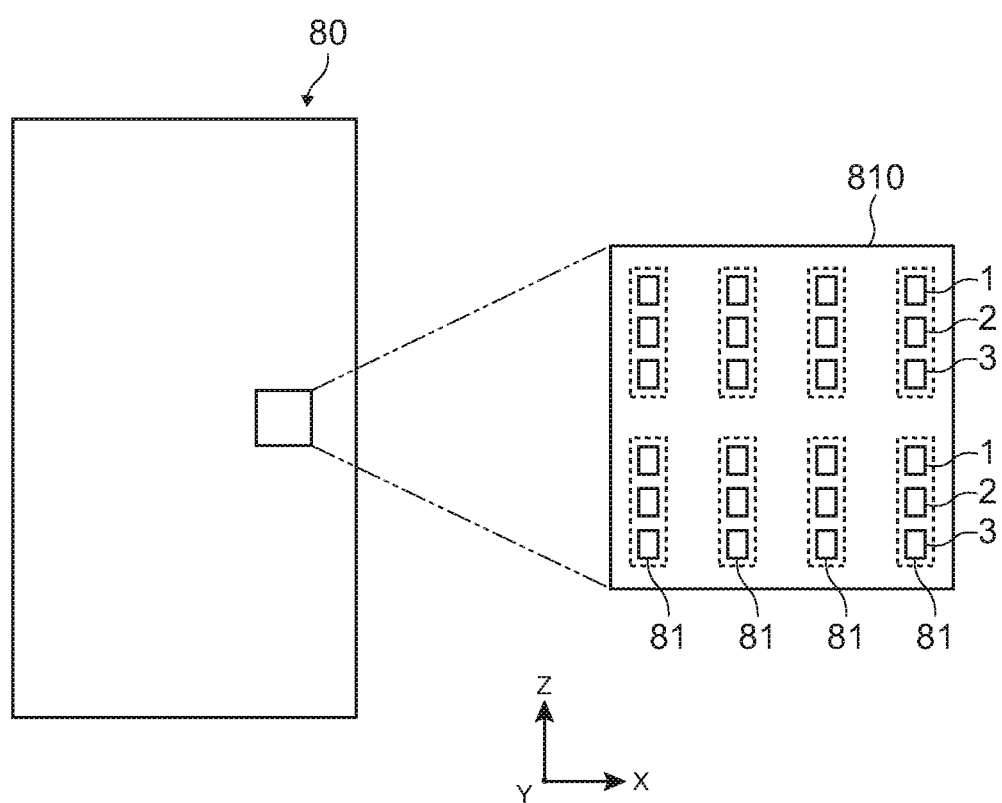
FIG. 11 A schematic plan view of a display apparatus including the semiconductor light-emitting element.

FIG. 11 is a schematic plan view of a display apparatus 80 including the semiconductor light-emitting element 1 according to this embodiment. Specifically, a semiconductor light-emitting element (first semiconductor light-emitting element) 1 that emits red light constitutes a semiconductor light-emitting element unit 81 with another semiconductor light-emitting element (second semiconductor light-emitting element) 2 that emits blue light and another semiconductor light-emitting element (third semiconductor light-emitting element) 3 that emits green light. A semiconductor light-emitting element module in which a plurality of semiconductor light-emitting element units 81 are arranged is mounted on a substrate 810 on which a driving circuit of the display apparatus 80 is formed.

The respective semiconductor light-emitting elements 1, 2, and 3 on the substrate 810 are typically sealed with the sealing resin layer 90. The sealing resin layer 90 may be individually formed on each element or may be formed to cover all the elements as a single layer.

Second Embodiment

Figure 12:
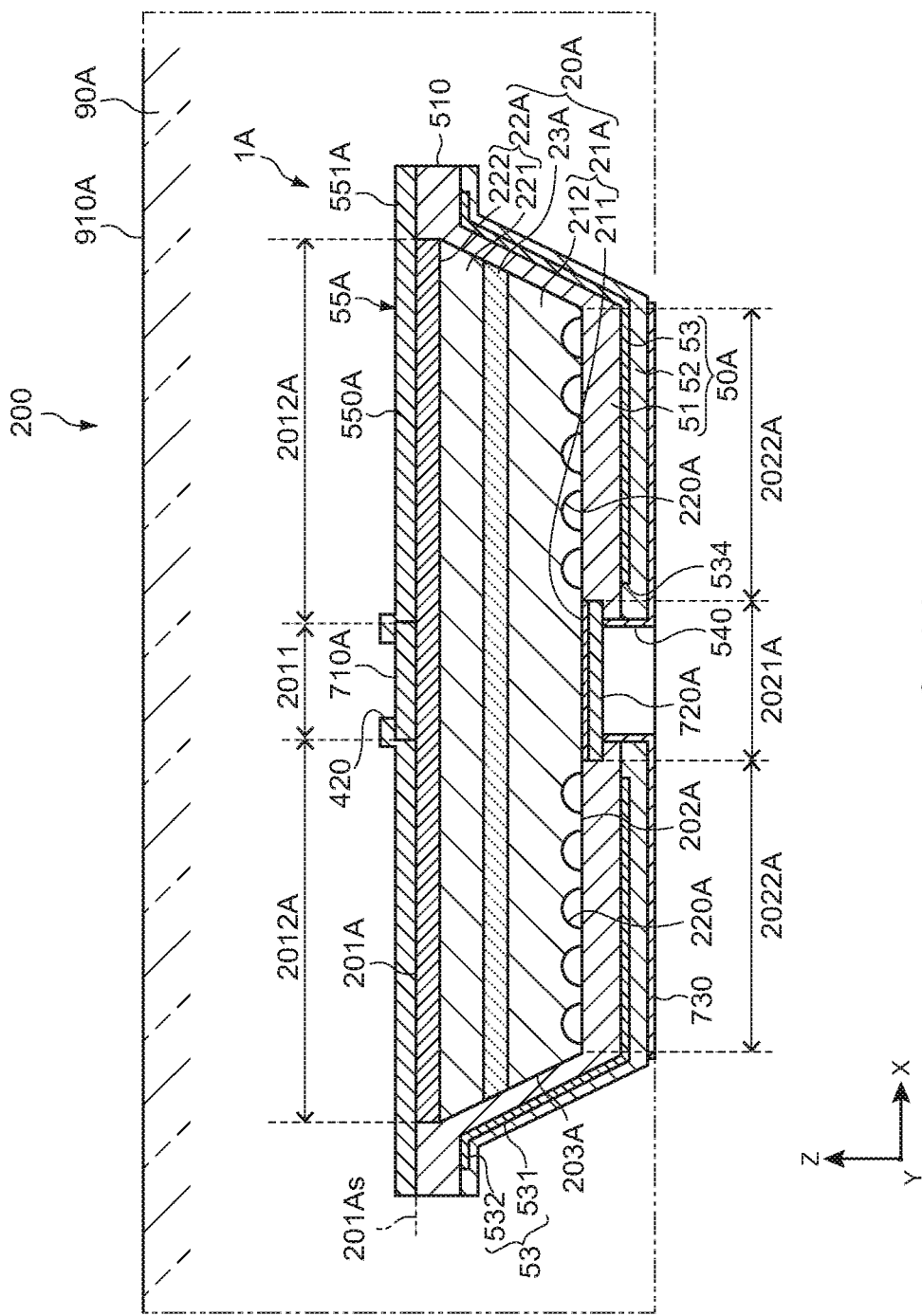
FIG. 12 A schematic cross-sectional view of a light-emitting apparatus including a semiconductor light-emitting element according to a second embodiment of the present technology.

FIG. 12 is a schematic cross-sectional view of a light-emitting apparatus 200 including a semiconductor light-emitting element 1A according to a second embodiment of the present technology. In the figure, portions corresponding to those of the first embodiment will be denoted by the same reference signs and the detailed descriptions will be omitted.

The semiconductor light-emitting element 1A according to this embodiment is different from that of the first embodiment in that light extraction regions 2012A of the light-emitting layer 20A is a flat surface orthogonal to the Z-axis direction and a second optical functional film 55A to be described later is configured to coat the light extraction regions 2012A of a first surface 201A of the light-emitting layer 20A.

As in the first embodiment, the light-emitting layer 20A includes the first surface 201A including a first electrode 710A, a second surface 202A that includes a second electrode 720A and is opposite to the first surface 201A, and a peripheral surface 203A that continuously connects the first surface 201A and the second surface 202A to each other, and is constituted by a semiconductor. The light-emitting layer 20A includes a GaAs-based or AlGaInP-based semiconductor compound that emits red light for example, though not limited thereto.

Moreover, as in the first embodiment, the light-emitting layer 20A includes a first semiconductor layer 21A having a first electrical conduction type, an active layer 23A formed on the first semiconductor layer 21A, and a second semiconductor layer 22A having a second electrical conduction type formed on the active layer 23A. In this embodiment, the first electrical conduction type can be a p-type and the second electrical conduction type can be an n-type, though not limited thereto.

As in the first embodiment, a shape of the light-emitting layer 20A is a square truncated pyramid in which the first surface 201A is formed to be larger than the second surface 202A, and the peripheral surface 203A is constituted by a taper surface.

As in the first embodiment, the first surface 201A of the semiconductor light-emitting element 1A according to this embodiment is coated with a light transmissive sealing resin layer 90A. In this embodiment, in the semiconductor light-emitting element 1A, an inorganic film may be formed between the first surface 201A of the light-emitting layer 20A and the second optical functional film 55A or a configuration without the inorganic film may be employed as shown in FIG. 12.

The second optical functional film 55A coats the first surface 201A of the light-emitting layer 20A and has a function of limiting the angle of emission of light from the first surface 201A. In this embodiment, the second optical functional film 55A is constituted by a dielectric multi-layer film.

The second optical functional film 55A includes a flat portion 550A conforming to the light extraction regions 2012A and a third end portion 551A formed at a peripheral rim of the flat portion 550A on the first surface 201A of the light-emitting layer 20A. The third end portion 551A constitutes a flat surface formed in parallel with the first surface 201A and protrudes outward from the first surface 201. Here, it is assumed that "being formed in parallel with the first surface 201A" means being formed in parallel with a reference surface 201As of the first surface 201A.

Figure 13:
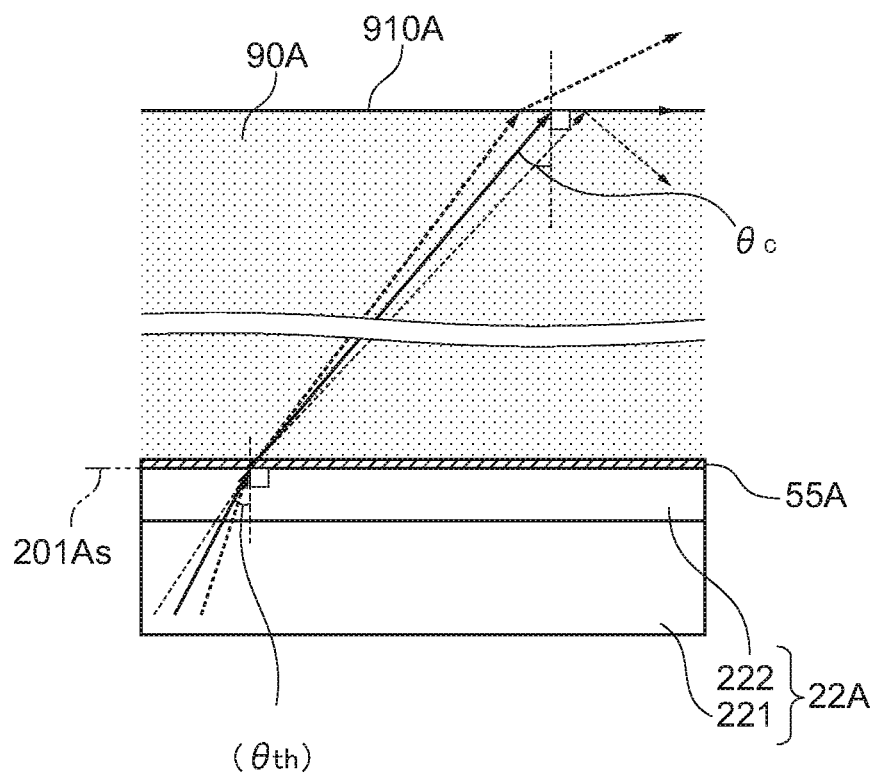
FIG. 13 A schematic diagram for describing an optical action which a second optical functional film needs in the aspect in which the semiconductor light-emitting element is sealed with the sealing resin.

FIG. 13 is a schematic diagram for describing an optical action, which the second optical functional film 55A needs in an aspect in which the semiconductor light-emitting element 1A is sealed with the sealing resin layer 90A as an example of this embodiment.

For example, in a case where the sealing resin layer 90A is an acryl-based sealing resin layer 90A (refractive index of 1.498), an interface in which light trapping due to total reflection is dominant is an interface 910A between the sealing resin layer 90A and the air. That is, out of angles of incidence $\theta_{in}$ with respect to the second optical functional film 55A (angle formed by the normal-line direction of the reference surface 201As of the first surface 201A and the light beam direction of the incident light), an angle of incidence $\theta_{in}$ of light emitted from the sealing resin layer 90A is limited to an upper limit angle $\theta$th due to influence of a critical angle $\theta$c of total reflection on the interface 910A. Here, the upper limit angle $\theta$th of light emitted from the sealing resin layer 90A is expressed by Expression (2) below on the basis of a refractive index $N_{in}$ of the second semiconductor layer 22A of the inorganic film and a refractive index $N_{out}$ of the sealing resin layer 90.

[Expression 2]

$$\theta_{th} = \sin^{-1}\left(\frac{N_{out}}{N_{in}}\sin\theta_c\right) \qquad (2)$$

In this embodiment, the upper limit angle $\theta$th is 18°, and light is emitted from the sealing resin layer 90A when the angle of incidence $\theta_{in}$ is smaller than $\theta$th as shown in FIG. 13. Meanwhile, light trapping occurs due to total reflection on the interface 910A when the angle of incidence $\theta_{in}$ is larger than $\theta$th.

Therefore, it is sufficient that the second optical functional film 55A has an angle-limiting action of the emission light to efficiently extract light having the angle of incidence $\theta_{in}$ smaller than the upper limit angle $\theta$th and reflect light having the angle of incidence $\theta_{in}$ larger than the upper limit angle $\theta$th. At this time, light reflected on the second optical functional film 55A returns into the semiconductor light-emitting element 1A and is re-used. That is, since the second optical functional film 55A has the angle-limiting action of the emission light, light trapping due to total reflection on the interface 910A can be suppressed and the emission efficiency of the emission light can be enhanced.

Figure 14:
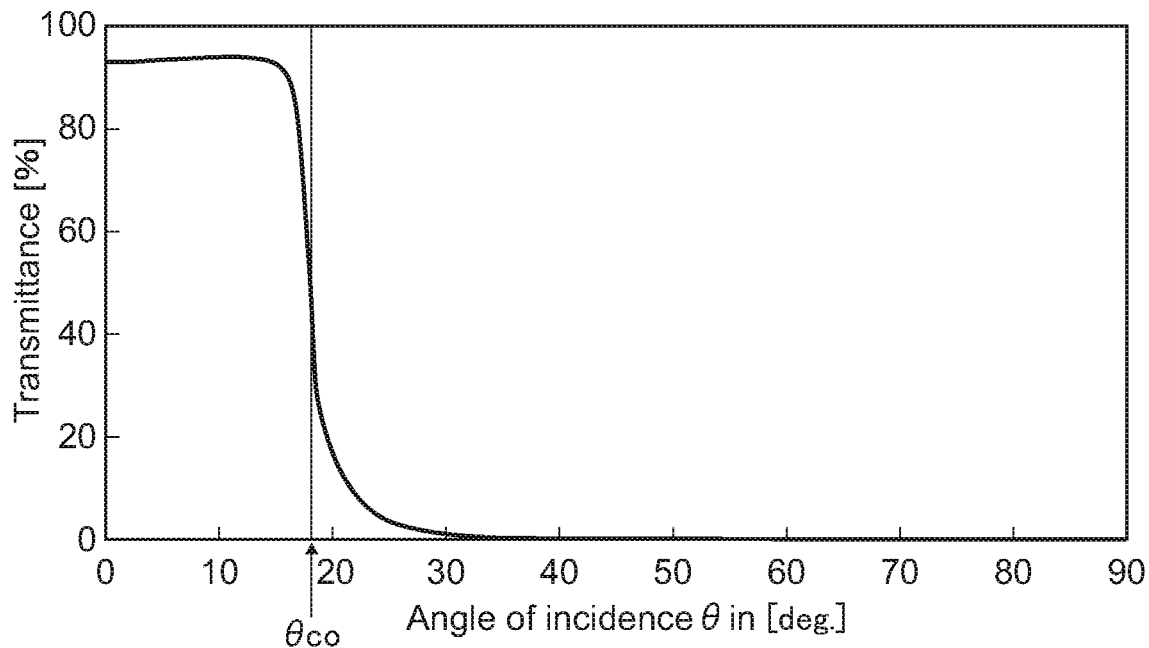
FIG. 14 A schematic view describing angle-of-incidence dependency of transmittance of the second optical functional film.

FIG. 14 is a schematic view describing angle-of-incidence dependency of transmittance of the second optical functional film 55A in this embodiment. In FIG. 14, a transmittance distribution of the second optical functional film 55A has a cut-off angle $\theta$co near 18°, shows higher transmittance in a range of $\theta$co or less of the angle of incidence $\theta_{in}$, and shows lower transmittance, i.e., higher reflectance in a range of $\theta$co or more on the contrary. It is desirable that a cut-off angle $\theta$co be adjusted as appropriate on the basis of Expression (2) in a manner that depends on embodiments.

In this embodiment, by constituting the second optical functional film 55A by a dielectric multi-layer film, the angle-limiting action of the emission light can be realized. A dielectric multi-layer film is formed by alternately stacking a higher refractive index material and a lower refractive index material, and desired optical characteristics (angle dependency, reflectance) can be realized by suitably designing the film thickness of each layer. For example, a higher refractive index material is a dielectric material such as $Nb_2O_5$ and $TiO_2$ and a lower refractive index material is a dielectric material such as $SiO_2$.

Figure 15:
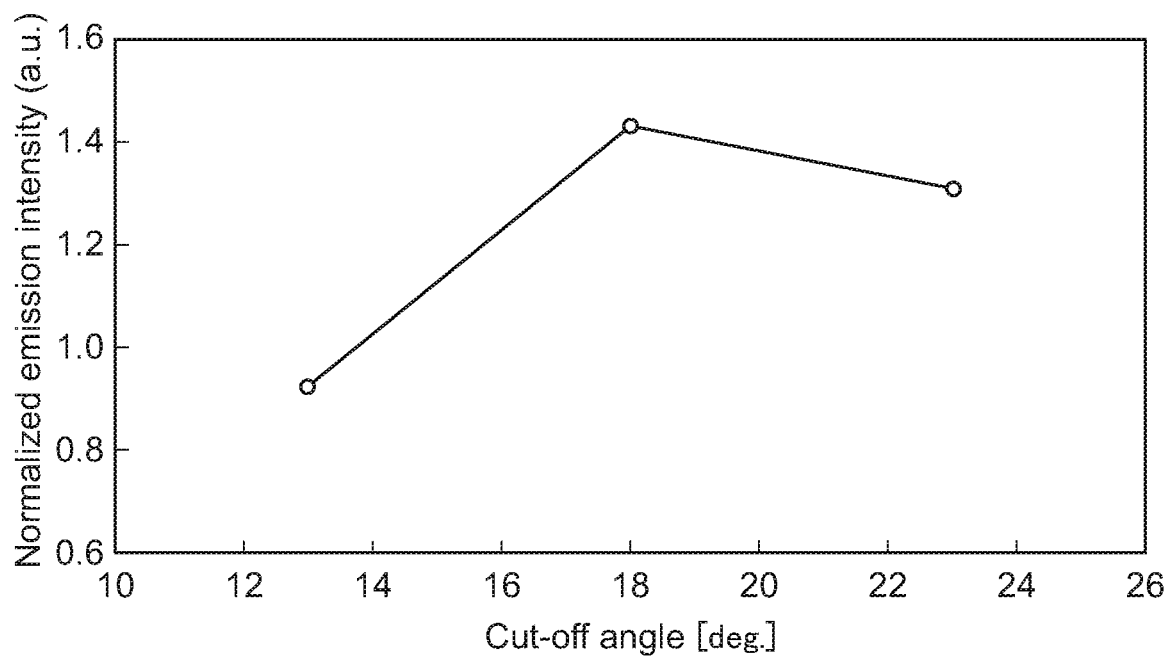
FIG. 15 A graph showing emission intensity of emission light in the aspect in which the semiconductor light-emitting element is sealed with the sealing resin.

FIG. 15 is a graph showing the emission intensity of emission light in an aspect in which the semiconductor light-emitting element 1A is sealed with the acryl-based sealing resin layer 90A (having a refractive index of 1.498). The horizontal axis shown in FIG. 15 indicates a cut-off angle $\theta$co of the angle-of-incidence dependency of the transmittance of the second optical functional film 55A and the vertical axis indicates emission intensity in the forward direction (normalized intensity when the intensity in the comparative example without the second optical functional film is 1).

Referring to FIG. 15, when the cut-off angle $\theta$co of the angle-of-incidence dependency of the transmittance of the second optical functional film 55A is at approximately 18° equal to the upper limit angle $\theta$th, the emission efficiency in the forward direction is higher. Here, when the cut-off angle $\theta$co is smaller than $\theta$th, the amount of light that is reflected on the second optical functional film 55A and trapped in the semiconductor light-emitting element 1A increases, and thus the efficiency lowers. Moreover, when the cut-off angle $\theta$co is larger than $\theta$th, the amount of light that is totally reflected on the interface 910A and trapped in the sealing resin layer 90A increases, and thus the efficiency lowers. In this manner, the emission efficiency in the forward direction can be enhanced by adjusting the angle-limiting action of the emission light of the second optical functional film 55A.

In addition, the orientation of emission light of the semiconductor light-emitting element 1A can be adjusted by a second convexo-concave structures 220A formed in the second surface 202A of the light-emitting layer 20A. As in the first embodiment, the second convexo-concave structures 220A has a structure in which recess portions constituted by at least one hemisphere, elliptical hemisphere, cone, truncated cone, pyramid, or truncated pyramid or a combination of two or more of them are arranged in a two-dimensional form inside the second surface 202A. Hereinafter, actions related to the orientation of emission light of the second convexo-concave structures 220A will be described.

As shown in FIG. 12, in the second surface 202A of the light-emitting layer 20A, reflection regions 2022A are arranged surrounding a connection region 2021A in which the second electrode 720A is formed. In this embodiment, the hemisphere-shaped second convexo-concave structures 220A are arranged in a hexagonal lattice form in the reflection regions 2022A as in the first embodiment. Moreover, as in the first embodiment, the reflection regions 2022A is coated with a first optical functional film 50A constituted by a laminate structure of the first insulating layer 51, the second insulating layer 52, and the reflecting layer.

Figure 16:
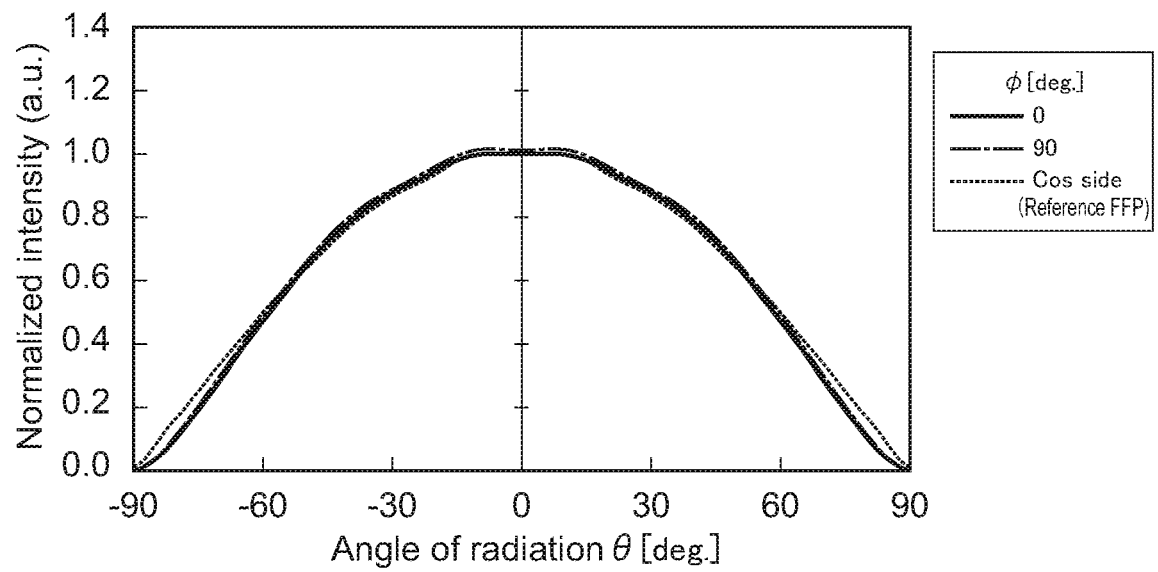
FIG. 16 A graph showing an FFP as emission light is viewed in the plurality of directions orthogonal to the normal-line direction of the first surface in the semiconductor light-emitting element.
Figure 17:
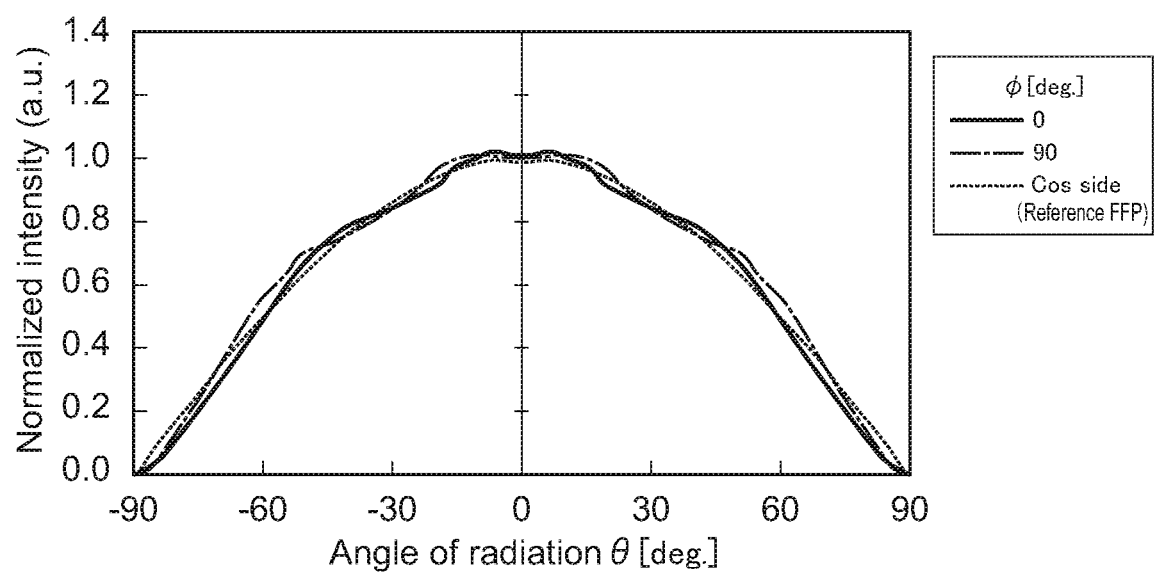
FIG. 17 A graph showing the FFP as emission light is viewed in the plurality of directions orthogonal to the normal-line direction of the first surface in the comparative example of the semiconductor light-emitting element.

FIGS. 16 and 17 are graphs each showing an FFP as emission light is viewed in a plurality of directions orthogonal to the normal-line direction of the first surface 201A (in a direction parallel to the Z-axis direction). The horizontal axis indicates an angle of radiation $\theta$ and the vertical axis indicates radiation light intensity (normalized intensity where the intensity of $\theta=0°$ is 1). FIG. 16 shows a result in this embodiment with the second convexo-concave structures 220A and FIG. 17 shows a result in the comparative example with no second convexo-concave structures.

Referring to FIGS. 16 and 17, both the FFPs show substantially constant shapes irrespective of the angle $\phi$. It is because optical characteristics of the second optical functional film 55A are isotropic about the Z-axis.

Referring to FIG. 16, it can be seen that extremely favorable Lambertian properties are shown in both the FFPs. On the other hand, referring to FIG. 17, slight undulations are present at some angles $\theta$ at which the emission light is viewed and it has the Lambertian property inferior to the FFPs shown in FIG. 16. It is because due to the square truncated pyramid configuration of the light-emitting layer 20A, the graph of FIG. 17 shows a peak resulting from the structure. In contrast, since the second surface 202A has the second convexo-concave structures 220A and a random property is added when light is reflected on the hemisphere-shaped surface, the orientation of emission light is isotropic in the graph of FIG. 16. Therefore, it has been confirmed that with the second convexo-concave structures 220A, the viewing angle dependency of the light emission intensity can be lowered, the FFP can be set to be ideal Lambertian, and the light distribution property of the emission light can be enhanced.

It should be noted that the second convexo-concave structures 220A each have the hemisphere shape in the example of this embodiment, though the shape is not limited thereto. An elliptical hemisphere, cone, truncated cone, pyramid, or truncated pyramid shape may be employed. Moreover, the second convexo-concave structures 220A are arranged in the hexagonal lattice form, though the direction and type of arrangement are not limited thereto. It should be noted that the arrangement density is desirably increased to prevent flat regions from being left in the reflection regions 2022A as much as possible. In addition, although the regions in which the second convexo-concave structures 220A are arranged are arranged in two island shapes on the left- and right-hand sides of the connection region 2021A, the second convexo-concave structures 220A may be continuously arranged in the entire reflection regions 2022A.

Also in this embodiment, as in the first embodiment, the emission efficiency in the forward direction and the light distribution property of the emission light in the semiconductor light-emitting element 1A can be enhanced. By mounting the semiconductor light-emitting element 1A on a substrate on which a driving circuit is formed with the second semiconductor light-emitting element that emits blue light and the third light-emitting element that emits green light, a display apparatus as shown in FIG. 11 may be configured.

Third Embodiment

Figure 18:
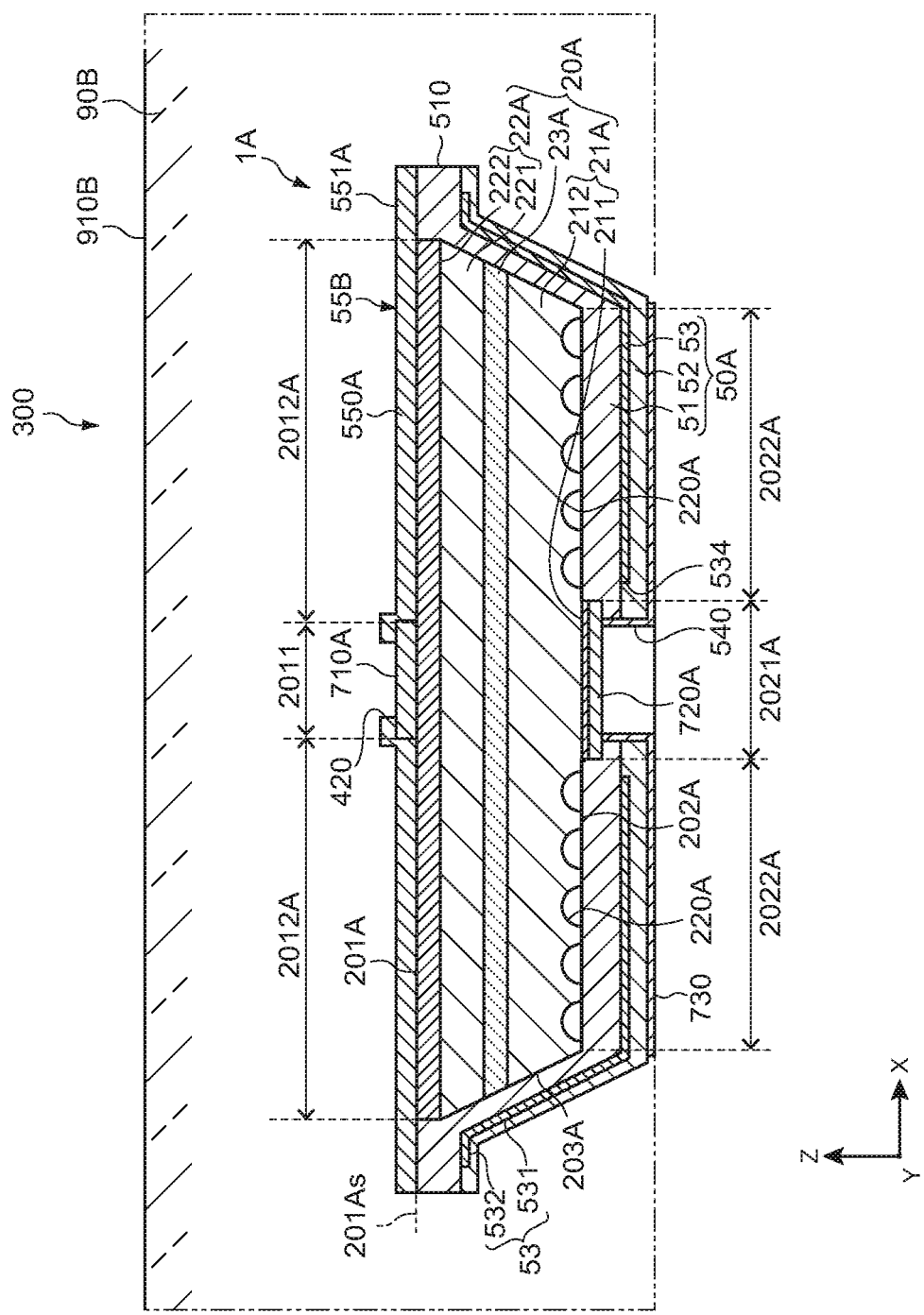
FIG. 18 A schematic cross-sectional view of a light-emitting apparatus including a semiconductor light-emitting element according to a third embodiment of the present technology.

FIG. 18 is a schematic cross-sectional view of a light-emitting apparatus 300 according to the third embodiment of the present technology includes a semiconductor light-emitting element 1B. In the figure, portions corresponding to those of the second embodiment will be denoted by the same reference signs and the detailed descriptions will be omitted.

The semiconductor light-emitting element 1B according to this embodiment is different from that of a second embodiment in that a second optical functional film 55B is constituted by a diffractive optical element.

In this embodiment in which the semiconductor light-emitting element 1B is sealed with the sealing resin layer 90B, for suppressing light trapping due to total reflection on an interface 910B between the sealing resin layer 90B and the air and enhancing the emission efficiency of the emission light, it is sufficient that the second optical functional film 55B has the angle-limiting action of the emission light. Specifically, it is sufficient that the cut-off angle θco of the angle dependency of the transmittance of the second optical functional film 55B is adjusted as appropriate on the basis of Expression (2).

In this embodiment, the angle-limiting action of the emission light can be realized by constituting the second optical functional film 55B by a diffractive optical element. For example, a diffractive optical element is constituted by a transparent type volume hologram or plane hologram, a relief type diffraction grating, or the like.

In this embodiment, as in the second embodiment, the emission efficiency in the forward direction and the light distribution property of the emission light in the semiconductor light-emitting element 1B can be enhanced.

Although the embodiments of the present technology have been described above, it is needless to say that the present technology is not limited only to the above-mentioned embodiments and various modifications can be made without departing from the gist of the present technology.

For example, although in the above-mentioned embodiment, the second region of the reflecting layer protrudes in the direction parallel to the peripheral surface or the first surface of the light-emitting layer, the direction of protrusion is not particularly limited as long as it protrudes outward with respect to the light-emitting layer.

Although in the above-mentioned embodiment, the first optical functional film has the laminate structure of the first insulating layer, the reflecting layer, and the second insulating layer, the present technology is not limited to such a configuration as long as the first optical functional film includes the reflecting layer.

In the first embodiment, the inorganic film is formed on the first surface of the light-emitting layer, though not limited thereto. A configuration in which the semiconductor light-emitting element does not include the inorganic film may be employed. In contrast, for the semiconductor light-emitting element according to the second or third embodiment, a configuration in which the inorganic film is formed on the first surface may be employed.

In the first embodiment, the inorganic film has the convexo-concave structure conforming to the first surface, though not limited thereto. For example, even if the convexo-concave structure is formed on the first surface, a configuration in which the inorganic film does not have the convexo-concave structure may be employed.

In the above-mentioned embodiment, the light-emitting layer emits red light, though not limited thereto. For example, the light-emitting layer may emit blue or green light. For example, in a case where the light-emitting layer emits blue light, a GaN-based material or the like for example may be employed as the semiconductor material.

In addition, in the above-mentioned embodiment, the electronic apparatus is the display apparatus, though not limited thereto. For example, the electronic apparatus may be an illumination apparatus such as a car tail lamp or the like, an inspection apparatus equipped with an LED, a pickup apparatus capable of writing and reading an optical disc for example, or the like.

It should be noted that the present technology may also take the following configurations.

(1) A semiconductor light-emitting element including:
    a first electrode;
    a second electrode;
    a light-emitting layer constituted by a semiconductor, the light-emitting layer including a first surface that is connected to the first electrode and has a first convexo-concave structure, a second surface that is connected to the second electrode, has a second convexo-concave structure, and is opposite to the first surface, and a peripheral surface that continuously connects the first surface and the second surface to each other; and
    an optical functional film that coats the second surface and the peripheral surface and includes a reflecting layer capable of reflecting light emitted by the light-emitting layer.

(2) The semiconductor light-emitting element according to (1), in which
the peripheral surface is constituted by a taper surface.

(3) The semiconductor light-emitting element according to (1) or (2), in which
the optical functional film further includes
a first insulating layer formed between the light-emitting layer and the reflecting layer, and
a second insulating layer formed on the reflecting layer.

(4) The semiconductor light-emitting element according to any one of (1) to (3), in which
the second convexo-concave structure includes at least one hemisphere, elliptical hemisphere, cone, truncated cone, pyramid, or truncated pyramid or a combination of two or more of them.

(5) The semiconductor light-emitting element according to any one of (1) to (4), in which
the first convexo-concave structure includes a prism having a ridge.

(6) The semiconductor light-emitting element according to any one of (1) to (4), in which
the first convexo-concave structure includes at least one hemisphere, elliptical hemisphere, cone, truncated cone, pyramid, or truncated pyramid or a combination of two or more of them.

(7) The semiconductor light-emitting element according to any one of (1) to (6), further including
a light-transmissive sealing resin layer that coats the first surface.

(8) A semiconductor light-emitting element including:
a first electrode;
a second electrode;
a light-emitting layer constituted by a semiconductor, the light-emitting layer including a first surface that is connected to the first electrode, a second surface that is connected to the second electrode, has a second convexo-concave structure, and is opposite to the first surface, a peripheral surface that continuously connects the first surface and the second surface to each other;
a first optical functional film that coats the second surface and the peripheral surface and includes a reflecting layer capable of reflecting light emitted by the light-emitting layer; and
a second optical functional film that coats the first surface and limits an angle of emission of light from the first surface.

(9) The semiconductor light-emitting element according to (8), in which
the peripheral surface is constituted by a taper surface.

(10) The semiconductor light-emitting element according to (8) or (9), in which
the first optical functional film further includes
a first insulating layer formed between the light-emitting layer and the reflecting layer, and
a second insulating layer formed on the reflecting layer.

(11) The semiconductor light-emitting element according to any one of (8) to (10), in which
the convexo-concave structure includes at least one hemisphere, elliptical hemisphere, cone, truncated cone, pyramid, or truncated pyramid or a combination of two or more of them.

(12) The semiconductor light-emitting element according to any one of (8) to (11), in which
the second optical functional film includes a dielectric multi-layer film.

(13) The semiconductor light-emitting element according to any one of (8) to (11), in which
the second optical functional film includes a diffractive optical element.

(14) The semiconductor light-emitting element according to any one of (8) to (13), further including
a light-transmissive sealing resin layer that coats the first surface.

(15) An electronic apparatus including:
a substrate on which a driving circuit is formed; and
at least one first semiconductor light-emitting element including
a first electrode that is connected to the driving circuit,
a second electrode that is connected to the driving circuit,
a light-emitting layer constituted by a semiconductor, the light-emitting layer including a first surface that is connected to the first electrode and has a first convexo-concave structure, a second surface that is connected to the second electrode, has a second convexo-concave structure, and is opposite to the first surface, and a peripheral surface that continuously connects the first surface and the second surface to each other, and
an optical functional film that coats the second surface and the peripheral surface and includes a reflecting layer capable of reflecting light emitted by the light-emitting layer, the second surface being arranged on the substrate via the optical functional film.

(16) The electronic apparatus according to (15), in which
the first semiconductor light-emitting element includes a plurality of first semiconductor light-emitting elements that emits red light, and
the electronic apparatus further includes:
a plurality of second semiconductor light-emitting elements that is arranged on the substrate and emits blue light; and
a plurality of third semiconductor light-emitting elements that is arranged on the substrate and emits green light.

(17) An electronic apparatus including:
a substrate on which a driving circuit is formed; and
at least one first semiconductor light-emitting element including
a first electrode that is connected to the driving circuit,
a second electrode that is connected to the driving circuit,
a light-emitting layer constituted by a semiconductor, the light-emitting layer including a first surface that is connected to the first electrode, a second surface that is connected to the second electrode, has a second convexo-concave structure, and is opposite to the first surface, and a peripheral surface that continuously connects the first surface and the second surface to each other,
a first optical functional film that coats the second surface and the peripheral surface and includes a reflecting layer capable of reflecting light emitted by the light-emitting layer, and
a second optical functional film that coats the first surface and limits an angle of emission of light from the first surface, the second surface being arranged on the substrate via the first optical functional film.

(18) The electronic apparatus according to (17), in which
the first semiconductor light-emitting element includes a plurality of first semiconductor light-emitting elements that emits red light, the electronic apparatus further including:
a plurality of second semiconductor light-emitting elements that is arranged on the substrate and emits blue light; and a plurality of third semiconductor light-emitting elements that is arranged on the substrate and emits green light.

REFERENCE SIGNS LIST 1, 1A, 1B semiconductor light-emitting element (first semiconductor light-emitting element)
2 semiconductor light-emitting element (second semiconductor light-emitting element)
3 semiconductor light-emitting element (third semiconductor light-emitting element)
20, 20A light-emitting layer
40 inorganic film
50, 50A first optical functional film
51 first insulating layer
52 second insulating layer
53 reflecting layer
55A, 55B second optical functional film
80 display apparatus
90, 90A, 90B sealing resin
100, 200, 300 light-emitting apparatus
201, 201A first surface
202, 202A second surface
203, 203A peripheral surface
210 first convexo-concave structure
220, 220A second convexo-concave structure
810 substrate

The invention claimed is:
1. A semiconductor light-emitting element, comprising:
a first electrode;
a second electrode;
a light-emitting layer that comprises a semiconductor, wherein
the light-emitting layer is configured to emit light, and
the light-emitting layer includes:
a first surface connected to the first electrode, wherein the first surface includes a first convexo-concave structure;
a second surface connected to the second electrode, wherein
the second surface includes:
a connection region at a center portion of the second surface;
reflection regions that surround the connection region; and
a plurality of second convexo-concave structures in the reflection regions of the second surface, and
the second surface is opposite to the first surface; and
a peripheral surface that continuously connects the first surface with the second surface; and
an optical functional film that coats the second surface and the peripheral surface, wherein the optical functional film includes a reflecting layer configured to reflect the light emitted by the light-emitting layer.
2. The semiconductor light-emitting element according to claim 1, wherein the peripheral surface includes a taper surface.
3. The semiconductor light-emitting element according to claim 1, wherein the optical functional film further includes:
a first insulating layer between the light-emitting layer and the reflecting layer; and
a second insulating layer on the reflecting layer.
4. The semiconductor light-emitting element according to claim 1, wherein the plurality of second convexo-concave structures includes at least one of a hemisphere, an elliptical hemisphere, a cone, a truncated cone, a pyramid, or a truncated pyramid.
5. The semiconductor light-emitting element according to claim 1, wherein the first convexo-concave structure includes a prism having a ridge.
6. The semiconductor light-emitting element according to claim 1, wherein the first convexo-concave structure includes at least one of a hemisphere, an elliptical hemisphere, a cone, a truncated cone, a pyramid, or a truncated pyramid.
7. The semiconductor light-emitting element according to claim 1, further comprising a light-transmissive sealing resin layer that coats the first surface.
8. A semiconductor light-emitting element, comprising:
a first electrode;
a second electrode;
a light-emitting layer that comprises a semiconductor, wherein
the light-emitting layer is configured to emit light, and
the light-emitting layer includes:
a first surface connected to the first electrode;
a second surface connected to the second electrode, wherein
the second surface includes:
a connection region at a center portion of the second surface;
reflection regions that surround the connection region; and
a plurality of convexo-concave structures in the reflection regions of the second surface, and
the second surface is opposite to the first surface; and
a peripheral surface that continuously connects the first surface with the second surface;
a first optical functional film that coats the second surface and the peripheral surface, wherein the first optical functional film includes a reflecting layer configured to reflect the light emitted by the light-emitting layer; and
a second optical functional film that coats the first surface, wherein the second optical functional film is configured to limit an angle of emission associated with the light emitted from the first surface.
9. The semiconductor light-emitting element according to claim 8, wherein the peripheral surface includes a taper surface.
10. The semiconductor light-emitting element according to claim 8, wherein the first optical functional film further includes:
a first insulating layer between the light-emitting layer and the reflecting layer; and
a second insulating layer on the reflecting layer.
11. The semiconductor light-emitting element according to claim 8, wherein the plurality of convexo-concave structures includes at least one of a hemisphere, an elliptical hemisphere, a cone, a truncated cone, a pyramid, or a truncated pyramid.
12. The semiconductor light-emitting element according to claim 8, wherein the second optical functional film comprises a dielectric multi-layer film.
13. The semiconductor light-emitting element according to claim 8, wherein the second optical functional film comprises a diffractive optical element.
14. The semiconductor light-emitting element according to claim 8, further comprising a light-transmissive sealing resin layer that coats the first surface.

15. An electronic apparatus, comprising:
a substrate;
a driving circuit on the substrate; and
at least one first semiconductor light-emitting element that includes:
 a first electrode connected to the driving circuit;
 a second electrode connected to the driving circuit;
 a light-emitting layer that comprises a semiconductor, wherein
  the light-emitting layer is configured to emit light, and
  the light-emitting layer includes:
   a first surface connected to the first electrode, wherein the first surface includes a first convexo-concave structures;
   a second surface connected to the second electrode, wherein
    the second surface includes:
     a connection region at a center portion of the second surface;
     reflection regions that surround the connection region; and
     a plurality of second convexo-concave structures in the reflection regions of the second surface, and
    the second surface is opposite to the first surface; and
   a peripheral surface that continuously connects the first surface with the second surface; and
 an optical functional film that coats the second surface and the peripheral surface, wherein
  the optical functional film includes a reflecting layer configured to reflect the light emitted by the light-emitting layer, and
  the second surface is on the substrate via the optical functional film.

16. The electronic apparatus according to claim 15, wherein
 the first semiconductor light-emitting element comprises a plurality of first semiconductor light-emitting elements configured to emit red light, and
 the electronic apparatus further includes:
  a plurality of second semiconductor light-emitting elements on the substrate, wherein the plurality of second semiconductor light-emitting elements is configured to emit blue light; and
  a plurality of third semiconductor light-emitting elements on the substrate, wherein the plurality of third semiconductor light-emitting elements is configured to emit green light.

17. An electronic apparatus, comprising:
a substrate;
a driving circuit on the substrate; and
at least one first semiconductor light-emitting element that includes:
 a first electrode connected to the driving circuit;
 a second electrode connected to the driving circuit;
 a light-emitting layer that comprises a semiconductor, wherein
  the light-emitting layer is configured to emit light, and
  the light-emitting layer includes:
   a first surface connected to the first electrode;
   a second surface connected to the second electrode, wherein
    the second surface includes:
     a connection region at a center portion of the second surface;
     reflection regions that surround the connection region; and
     a plurality of convexo-concave structures in the reflection regions of the second surface, and
    the second surface is opposite to the first surface; and
   a peripheral surface that continuously connects the first surface with the second surface;
 a first optical functional film that coats the second surface and the peripheral surface, wherein
  the first optical functional film includes a reflecting layer configured to reflect the light emitted by the light-emitting layer, and
  the second surface is on the substrate via the first optical functional film; and
 a second optical functional film that coats the first surface, wherein the second optical functional film is configured to limit an angle of emission associated with the light emitted from the first surface.

18. The electronic apparatus according to claim 17, wherein
 the first semiconductor light-emitting element comprises a plurality of first semiconductor light-emitting elements configured to emit red light, and
 the electronic apparatus further includes:
  a plurality of second semiconductor light-emitting elements on the substrate, wherein the plurality of second semiconductor light-emitting elements is configured to emit blue light; and
  a plurality of third semiconductor light-emitting elements on the substrate, wherein the plurality of third semiconductor light-emitting elements is configured to emit green light.

* * * * *